(12) United States Patent
Koyama et al.

(10) Patent No.: US 12,542,550 B2
(45) Date of Patent: Feb. 3, 2026

(54) DRIVE CIRCUIT AND SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Masahiro Koyama, Tokyo (JP); Yasuyuki Fujiwara, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 18/825,108

(22) Filed: Sep. 5, 2024

(65) Prior Publication Data

US 2025/0337403 A1 Oct. 30, 2025

(30) Foreign Application Priority Data

Apr. 30, 2024 (JP) .................. 2024-073700

(51) Int. Cl.
*H03K 17/0812* (2006.01)
*H02M 1/08* (2006.01)

(52) U.S. Cl.
CPC ........ *H03K 17/08122* (2013.01); *H02M 1/08* (2013.01); *H03K 2217/0081* (2013.01)

(58) Field of Classification Search
CPC .. H03K 17/08; H03K 17/081; H03K 17/0812; H03K 17/08122; H03K 17/14; H03K 17/145; H03K 17/22; H03K 17/223; H03K 17/10; H02M 1/08; H02M 1/083; H02M 1/084

USPC .................................................. 327/108–112
See application file for complete search history.

(56) References Cited

U.S. PATENT DOCUMENTS

| | | | |
|---|---|---|---|
| 10,734,911 B2 | 8/2020 | Miyazaki et al. | |
| 11,381,237 B2* | 7/2022 | Fujiwara | H03K 17/6871 |
| 11,496,041 B2 | 11/2022 | Ikarashi et al. | |
| 11,652,473 B2* | 5/2023 | Curbow | H03K 17/0822 327/109 |

(Continued)

FOREIGN PATENT DOCUMENTS

| | | |
|---|---|---|
| JP | 2017118630 A | 6/2017 |
| JP | 2021151039 A | 9/2021 |

(Continued)

OTHER PUBLICATIONS

Rohm, SiC power module, Anti-ignition by active Miller clamp, Application Note: 63AN041J Rev.001, 2020, pp. 1-14.

*Primary Examiner* — Hai L Nguyen
(74) *Attorney, Agent, or Firm* — Maier & Maier, PLLC

(57) ABSTRACT

A drive circuit of an embodiment is a drive circuit that normally-off drives a transistor circuit constituted of a normally-on-type first transistor and a normally-off-type second transistor which are connected in series. The drive circuit of the embodiment has a clamping transistor that is disposed between a wiring, which is connected between the first transistor and the second transistor, and a drive terminal of the first transistor, and a capacitor that is disposed between the clamping transistor and the wiring and is connected to the clamping transistor in series.

20 Claims, 16 Drawing Sheets

(56) References Cited

U.S. PATENT DOCUMENTS

| | | | |
|---|---|---|---|
| 12,149,233 B2* | 11/2024 | Shapiro | ............ H03K 17/08122 |
| 2020/0035656 A1 | 1/2020 | Miyazaki et al. | |
| 2022/0094353 A1 | 3/2022 | Fujiwara et al. | |

FOREIGN PATENT DOCUMENTS

| | | | |
|---|---|---|---|
| JP | 2021158669 A | 10/2021 | |
| JP | 2022051278 A | 3/2022 | |
| JP | 7157046 B2 | 10/2022 | |
| WO | 2018112302 A1 | 6/2018 | |
| WO | 2018186353 A1 | 10/2018 | |

* cited by examiner

DRIVE CIRCUIT AND SEMICONDUCTOR DEVICE

CROSS-REFERENCE TO RELATED APPLICATION

This application is based upon and claims the benefit of priority from Japanese Patent Application No. 2024-073700, filed Apr. 30, 2024, the entire contents of which are incorporated herein by reference.

FIELD

Embodiments described herein relate to a drive circuit and a semiconductor device.

BACKGROUND

A technology in which a transistor circuit is constituted by connecting a normally-off-type transistor to a normally-on-type transistor in series and the transistor circuit is normally-off driven is known. For example, when a half-bridge circuit is constituted by connecting two such transistor circuits described above and the half-bridge circuit is caused to perform a switching operation, there is a problem in that undershooting occurs in drive voltage of a transistor included in the transistor circuit on a higher side when the transistor circuit on a lower side is in an OFF state. Regarding this, it is known that the occurrence of undershooting in drive voltage is curbed using a Zener diode. However, there is a limit to a reaction time of the Zener diode, and there is a problem in that undershooting cannot be sufficiently curbed.

DETAILED DESCRIPTION

A drive circuit of an embodiment is a drive circuit that normally-off drives a transistor circuit constituted of a normally-on-type first transistor and a normally-off-type second transistor which are connected in series. The drive circuit of the embodiment has a clamping transistor that is disposed between a wiring, which is connected between the first transistor and the second transistor, and a drive terminal of the first transistor; and a capacitor that is disposed between the clamping transistor and the wiring and is connected to the clamping transistor in series.

Hereinafter, a drive circuit and a semiconductor device according to embodiments will be described with reference to the drawings.

First Embodiment

Figure 1:
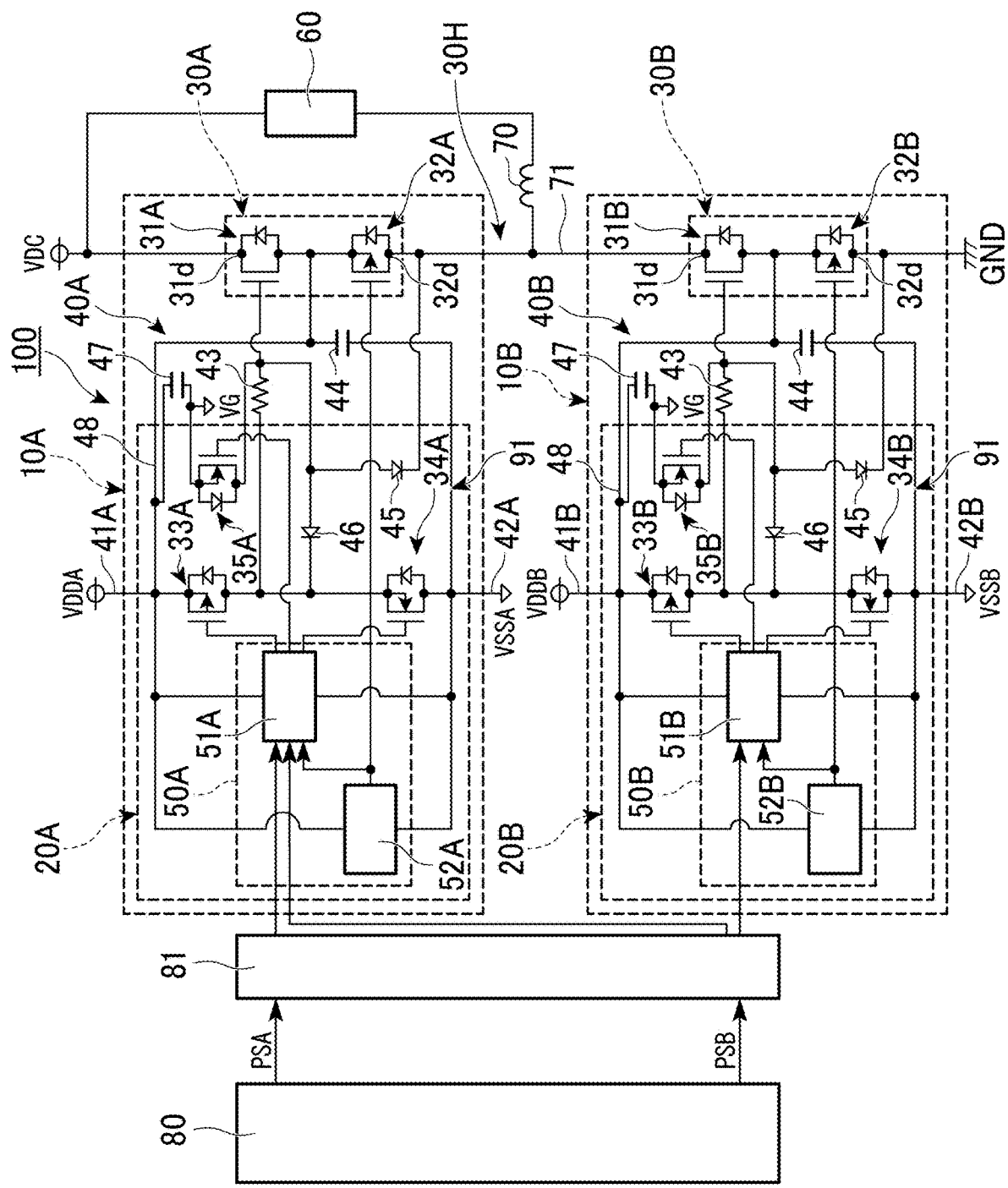
FIG. 1 is a circuit diagram showing a semiconductor device of a first embodiment.

FIG. 1 is a circuit diagram showing a semiconductor device 100 of a first embodiment. The semiconductor device 100 shown in FIG. 1 is a semiconductor device for supplying power to an external load 60. The semiconductor device 100 is used as a power conversion circuit such as a power source circuit or an inverter circuit through connection to a power source, the external load 60, and a coil 70. A method for connecting the external load 60 and the coil 70 is not limited to the connection method shown in FIG. 1. The semiconductor device 100 is controlled by a controller 80. Pulse signals PSA and PSB are input to the semiconductor device 100 from the controller 80 via an insulation transfer circuit 81.

As shown in FIG. 1, in the first embodiment, the semiconductor device 100 includes two semiconductor packages 10A and 10B. The semiconductor package 10A and the semiconductor package 10B are provided such that they are connected to each other in series between a power source VDC for supplying power to the external load 60 and a ground GND. The semiconductor package 10A is a semiconductor package on a higher side leading to the power source VDC. The semiconductor package 10B is a semiconductor package on a lower side leading to the ground GND. In the first embodiment, the external load 60 is connected to the power source VDC in parallel to the semiconductor package 10A. The coil 70 is disposed between a wiring portion 71, which connects the semiconductor package 10A and the semiconductor package 10B, and the external load 60. The wiring portion 71 is a wiring portion connecting a transistor circuit 30A and a transistor circuit 30B which will be described below.

In the circuits of the present disclosure, "an additional element is disposed between a certain element and a different element" denotes that the additional element is provided on a circuit between the certain element and the different element in a manner of leading from one to the other.

In the first embodiment, the semiconductor package 10A and the semiconductor package 10B differ in operational timing and the like in the semiconductor device 100 but have structures which are the same as each other. For this reason, in the following description, the constitution of the semiconductor package 10A on the higher side will be described representatively, and description of the constitution of the semiconductor package 10B on the lower side may be omitted.

The semiconductor package 10A has the transistor circuit 30A and a drive circuit 40A. The semiconductor package 10B has the transistor circuit 30B and a drive circuit 40B. Each of the semiconductor packages 10A and 10B is constituted of each of the drive circuits 40A and 40B and each of the transistor circuits 30A and 30B sealed in one package. The drive circuit 40A and the transistor circuit 30A may not be sealed in one package, and the drive circuit 40B and the transistor circuit 30B may not be sealed in one package. The two transistor circuits 30A and 30B are connected to each other in series. A half-bridge circuit 30H is constituted of the two transistor circuits 30A and 30B. The transistor circuit 30A and the transistor circuit 30B are connected to each other through the wiring portion 71.

Figure 2:
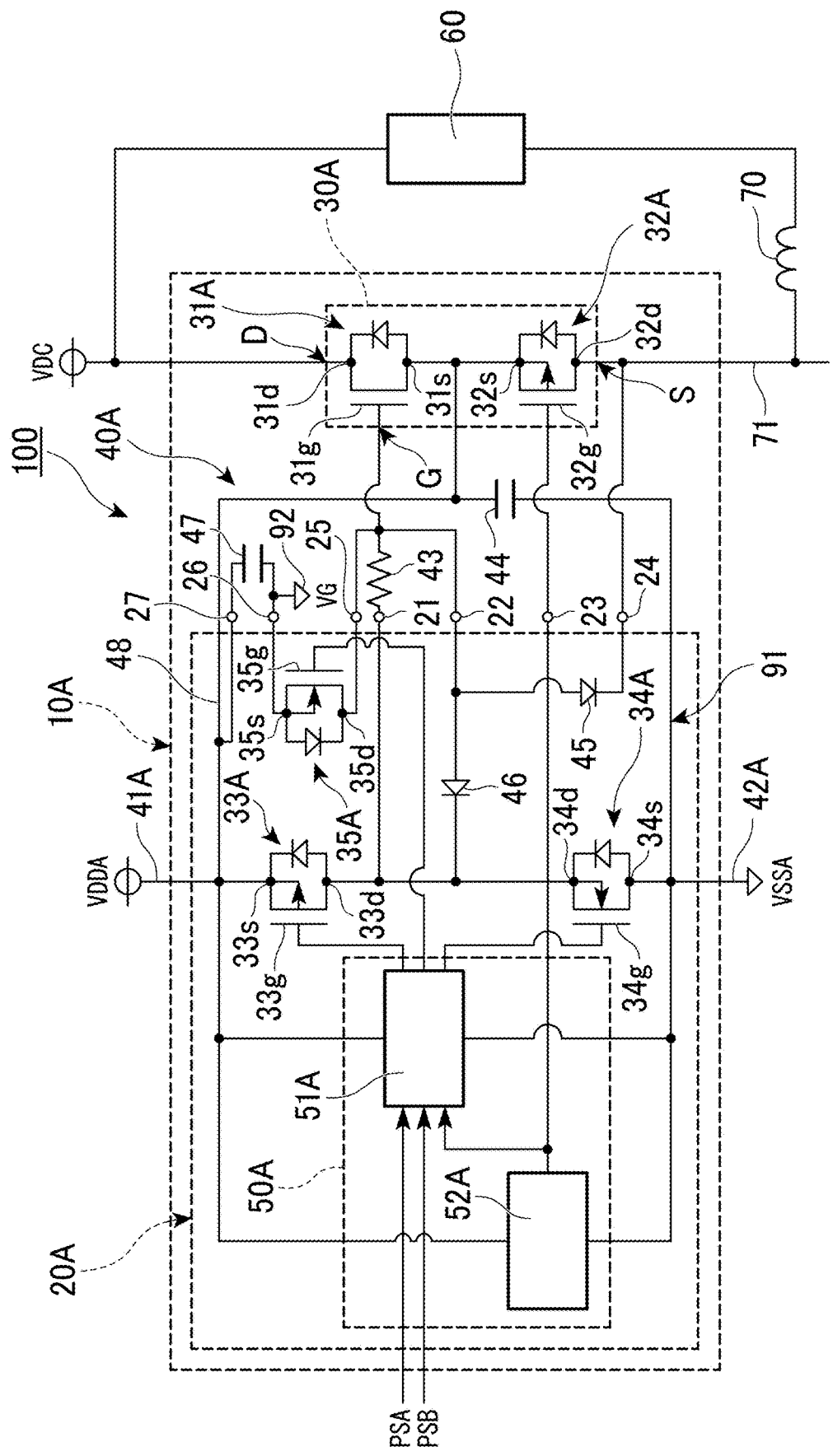
FIG. 2 is a circuit diagram showing a semiconductor package of the first embodiment.

FIG. 2 is a circuit diagram showing the semiconductor package 10A. As shown in FIG. 2, the transistor circuit 30A has a constitution in which a first transistor 31A and a second transistor 32A are connected in series. The first transistor 31A is a normally-on-type transistor. The first transistor 31A is a field-effect transistor (FET). For example, the first transistor 31A is a high-electron mobility transistor (HEMT) using gallium nitride (GaN). The first transistor 31A is a high-withstand-voltage element whose withstand voltage is approximately 600 V or higher, for example. A drain terminal 31d of the first transistor 31A is connected to the power source VDC. A source terminal 31s of the first transistor 31A is connected to a source terminal 32s of the second transistor 32A. The first transistor 31A is in an ON state when the potential difference between a gate terminal 31g and the source terminal 31s is 0 V. A threshold voltage of the first transistor 31A has a negative voltage value. In the following description, it is assumed that the threshold voltage of the first transistor 31A is-Vth, and the absolute value of the threshold voltage of the first transistor 31A is Vth. The first transistor 31A is in an OFF state if a gate voltage becomes lower than-Vth with respect to the source terminal 31s.

The second transistor 32A is a normally-off-type transistor. The second transistor 32A is a field-effect transistor. In the first embodiment, the second transistor 32A is a P channel-type field-effect transistor. More specifically, the second transistor 32A is a P channel-type metal-oxide-semiconductor field-effect transistor (MOSFET). The withstand voltage of the second transistor 32A is lower than the withstand voltage of the first transistor 31A. The second transistor 32A is a low-withstand-voltage MOSFET whose withstand voltage is approximately 60 V or lower, for example. The source terminal 32s of the second transistor 32A is connected to the source terminal 31s of the first transistor 31A. A drain terminal 32d of the second transistor 32A is connected to the wiring portion 71 connecting the two transistor circuits 30A and 30B to each other.

The transistor circuit 30A constituted of the first transistor 31A and the second transistor 32A can be regarded as one normally-off-type field-effect transistor. When the transistor circuit 30A is regarded as one field-effect transistor, a gate terminal G of the field-effect transistor is the gate terminal 31g of the first transistor 31A, a drain terminal D of the field-effect transistor is the drain terminal 31d of the first transistor 31A, and a source terminal S of the field-effect transistor is the drain terminal 32d of the second transistor 32A.

In the present disclosure, a gate terminal of a field-effect transistor corresponds to "a drive terminal". A drive terminal of a transistor is a terminal to which a voltage is applied so as to drive the transistor. In a drain terminal and a source terminal of a field-effect transistor, the terminal on a side where a current goes out when the field-effect transistor is in the ON state corresponds to "an output terminal". Namely, the drain terminal corresponds to "an output terminal" in a P channel-type field-effect transistor, and the source terminal corresponds to "an output terminal" in an N channel-type field-effect transistor.

The drive circuit 40A is a drive circuit that normally-off drives the transistor circuit 30A. The drive circuit 40A is a gate drive circuit for applying a voltage to the gate terminal G of the transistor circuit 30A, that is, the gate terminal 31g of the first transistor 31A. The drive circuit 40A has a semiconductor chip 20A, a resistive element 43, a first capacitor 44, a second capacitor 47, and a second ground 92. The semiconductor chip 20A has a power source voltage terminal 41A, a ground element 42A, connection terminals 21, 22, 23, 24, 25, 26, and 27, a power source voltage wiring 48, a first ground 91, a third transistor 33A, a fourth transistor 34A, a fifth transistor 35A, a first diode 45, a second diode 46, and a control circuit 50A.

The power source voltage terminal 41A is exposed to the outside of the semiconductor chip 20A. A power source for driving the drive circuit 40A is connected to the power source voltage terminal 41A. A power source voltage VDDA is applied to the power source voltage terminal 41A. The power source voltage wiring 48 is connected to the power source voltage terminal 41A. The power source voltage VDDA is applied to the power source voltage wiring 48. The power source voltage wiring 48 is connected between the first transistor 31A and the second transistor 32A. The power source voltage wiring 48 is connected to the source terminal 31s of the first transistor 31A and the source terminal 32s of the second transistor 32A.

The ground element 42A is exposed to the outside of the semiconductor chip 20A. A ground having a reference potential VSSA that becomes a reference for the power source voltage VDDA is connected to the ground element 42A. The reference potential VSSA is a potential that becomes a reference when the drive circuit 40A operates. Accordingly, in the drive circuit 40A, the potential of the first ground 91 connected to the ground element 42A becomes the reference potential VSSA. The reference potential VSSA is not particularly limited as long as it is a potential that becomes a reference for the power source voltage VDDA.

The connection terminals 21, 22, 23, 24, 25, 26, and 27 are exposed to the outside of the semiconductor chip 20A. The resistive element 43 is connected to the connection terminal 21. The gate terminal 31g of the first transistor 31A is connected to the connection terminal 22 and the connection terminal 25. The connection terminal 22 and the connection terminal 25 may serve as one common terminal. A gate terminal 32g of the second transistor 32A is connected to the connection terminal 23. The drain terminal 32d of the second transistor 32A is connected to the connection terminal 24. One electrode of the second capacitor 47 and the second ground 92 are connected to the connection terminal 26. The other electrode of the second capacitor 47 is connected to the connection terminal 27.

The third transistor 33A and the fourth transistor 34A are normally-off-type field-effect transistors. In the first embodiment, the third transistor 33A is a P channel-type MOSFET. In the first embodiment, the fourth transistor 34A is an N channel-type MOSFET. The third transistor 33A and the fourth transistor 34A are connected to each other in series and are disposed between the power source voltage wiring 48 and the first ground 91. A source terminal 33s of the third transistor 33A is connected to the power source voltage wiring 48. A drain terminal 33d of the third transistor 33A is connected to a drain terminal 34d of the fourth transistor 34A. A source terminal 34s of the fourth transistor 34A is connected to the first ground 91.

The gate terminal 31g of the first transistor 31A is connected between the third transistor 33A and the fourth transistor 34A via the resistive element 43. Accordingly, the third transistor 33A is disposed between the power source voltage wiring 48 and the gate terminal 31g of the first transistor 31A. The fourth transistor 34A is disposed between the first ground 91 and the gate terminal 31g of the first transistor 31A. The resistive element 43 is disposed between the gate terminal 31g of the first transistor 31A and the third transistor 33A. One end of the resistive element 43 is connected to the gate terminal 31g of the first transistor 31A. The other end of the resistive element 43 is connected to the drain terminal 33d of the third transistor 33A.

The fifth transistor 35A is a normally-off-type field-effect transistor. In the first embodiment, the fifth transistor 35A is an N channel-type MOSFET. In the first embodiment, the fifth transistor 35A corresponds to "a clamping transistor" that functions as a clamping element. The fifth transistor 35A constitutes an active mirror clamping circuit. The fifth transistor 35A is disposed between a wiring, which is connected between the first transistor 31A and the second transistor 32A, that is, the power source voltage wiring 48, and the gate terminal 31g of the first transistor 31A. The second capacitor 47 is disposed between the fifth transistor 35A and the power source voltage wiring 48. A drain terminal 35d of the fifth transistor 35A is connected to the gate terminal 31g of the first transistor 31A. A source terminal 35s of the fifth transistor 35A is an output terminal of the fifth transistor 35A and is connected to one electrode of the second capacitor 47 and the second ground 92. A gate terminal 35g of the fifth transistor 35A is connected to a switching circuit 51A (which will be described below) of the control circuit 50A.

An output capacitance Coss of the fifth transistor 35A is equal to or smaller than one tenth of an input capacitance Ciss of the first transistor 31A. The output capacitance Coss of the fifth transistor 35A is the sum of a drain-source capacitance Cds and a gate-drain capacitance Cgd of the fifth transistor 35A. The input capacitance Ciss of the first transistor 31A is the sum of a gate-source capacitance Cgs and the gate-drain capacitance Cgd of the first transistor 31A.

An anode of the first diode 45 is connected to the gate terminal 31g of the first transistor 31A and the drain terminal 35d of the fifth transistor 35A. A cathode of the first diode 45 is connected to the drain terminal 32d of the second transistor 32A.

An anode of the second diode 46 is connected to the gate terminal 31g of the first transistor 31A and the drain terminal 35d of the fifth transistor 35A. The anode of the second diode 46 is connected to the anode of the first diode 45. A cathode of the second diode 46 is connected to the drain terminal 34d of the fourth transistor 34A.

The first capacitor 44 is disposed between the power source voltage wiring 48 and the first ground 91. One electrode of the first capacitor 44 is connected to the power source voltage wiring 48. The other electrode of the first capacitor 44 is connected to the first ground 91.

The second capacitor 47 is disposed between the fifth transistor 35A and the power source voltage wiring 48. The second capacitor 47 is connected to the fifth transistor 35A in series. One electrode of the second capacitor 47 is connected to the source terminal 35s of the fifth transistor 35A and the second ground 92. The other electrode of the second capacitor 47 is connected to the power source voltage wiring 48. An electrostatic capacitance of the second capacitor 47 is equal to or larger than ten times the input capacitance Ciss of the first transistor 31A. It is more preferable that the electrostatic capacitance of the second capacitor 47 be approximately 100 times the input capacitance Ciss of the first transistor 31A.

The second ground 92 is a ground provided separately from the first ground 91. The voltage of the second ground 92 is lower than the power source voltage VDD. The second ground 92 has a reference potential VG that becomes a reference when the fifth transistor 35A operates. In the first embodiment, the reference potential VG of the second ground 92 is the same as the reference potential VSSA of the first ground 91. Namely, in the first embodiment, the voltage of the second ground 92 is the same as the voltage of the first ground 91. The reference potential VG of the second ground 92 may differ from the reference potential VSSA of the first ground 91, and the voltage of the second ground 92 may differ from the voltage of the first ground 91.

The second ground 92 is insulated from the first ground 91 or is indirectly connected to the first ground 91 via an element having a relatively high impedance with respect to a current from the second ground 92 toward the first ground 91. For example, an element having a relatively high impedance is an element having an impedance higher than the impedance of a body diode of the fifth transistor 35A. For example, the element may also be a resistive element or may also be a diode in which the anode is connected to the first ground 91 and the cathode is connected to the second ground 92.

The control circuit 50A is a circuit for switching the second transistor 32A, the third transistor 33A, the fourth transistor 34A, and the fifth transistor 35A between the ON state and the OFF state. The control circuit 50A is disposed between the power source voltage wiring 48 and the first ground 91. The power source voltage VDDA is input to the control circuit 50A. The reference potential in the control circuit 50A is the reference potential VSSA. The control circuit 50A has the switching circuit 51A and a voltage comparison circuit 52A.

The switching circuit 51A is disposed between the power source voltage wiring 48 and the first ground 91. The power source voltage VDDA is input to the switching circuit 51A. The reference potential in the switching circuit 51A is the reference potential VSSA. The pulse signal PSA for switching the state of the transistor circuit 30A is input to the switching circuit 51A from the controller 80 via the insulation transfer circuit 81. In the first embodiment, the pulse signal PSB for switching the state of the transistor circuit 30B on the lower side is input to the switching circuit 51A from the controller 80 via the insulation transfer circuit 81. An output from the voltage comparison circuit 52A is input to the switching circuit 51A. A gate terminal 33g of the third transistor 33A, a gate terminal 34g of the fourth transistor 34A, and the gate terminal 35g of the fifth transistor 35A are connected to the switching circuit 51A.

In the first embodiment, the switching circuit 51A switches each of the third transistor 33A, the fourth transistor 34A, and the fifth transistor 35A between the ON state and the OFF state on the basis of the pulse signals PSA and PSB and an output from the voltage comparison circuit 52A. More specifically, the switching circuit 51A individually switches the state of each transistor by applying a voltage to the gate terminal 33g of the third transistor 33A and the gate terminal 34g of the fourth transistor 34A on the basis of the pulse signal PSA and an output from the voltage comparison circuit 52A. The switching circuit 51A switches the state of the fifth transistor 35A by applying a voltage to the gate terminal 35g of the fifth transistor 35A on the basis of the pulse signal PSB.

The voltage comparison circuit 52A is disposed between the power source voltage wiring 48 and the first ground 91. The power source voltage VDDA is input to the voltage comparison circuit 52A. The reference potential in the voltage comparison circuit 52A is the reference potential VSSA. The gate terminal 32g of the second transistor 32A is connected to the voltage comparison circuit 52A. The voltage comparison circuit 52A is a circuit outputting a comparison result by comparing the voltage of the power source voltage wiring 48, that is, the power source voltage VDDA with a voltage higher than the absolute value Vth of the threshold voltage of the first transistor 31A. The threshold voltage of the normally-on-type first transistor 31A has a negative value. The comparison result in the voltage comparison circuit 52A is output as a voltage value. The comparison result in the voltage comparison circuit 52A is output to the switching circuit 51A and the gate terminal 32g of the second transistor 32A.

As shown in FIG. 1, the transistor circuit 30B in the semiconductor package 10B on the lower side has a constitution in which a first transistor 31B and a second transistor 32B are connected in series. The first transistor 31B is a transistor similar to the first transistor 31A in the semiconductor package 10A on the higher side. The second transistor 32B is a transistor similar to the second transistor 32A in the semiconductor package 10A on the higher side. The drain terminal 31d of the first transistor 31B is connected to the drain terminal 32d of the second transistor 32A on the higher side. The drain terminal 32d of the second transistor 32B is connected to the ground GND.

The drive circuit 40B is a drive circuit that normally-off drives the transistor circuit 30B. The drive circuit 40B is a gate drive circuit for applying a voltage to the gate terminal of the transistor circuit 30B, that is, the gate terminal of the first transistor 31B. The drive circuit 40B has a semiconductor chip 20B, the resistive element 43, the first capacitor 44, and the second capacitor 47. The semiconductor chip 20B has a power source voltage terminal 41B, a ground element 42B, a third transistor 33B, a fourth transistor 34B, a fifth transistor 35B, and a control circuit 50B. The control circuit 50B has a switching circuit 51B and a voltage comparison circuit 52B. The pulse signal PSB is input to the switching circuit 51B from the controller 80 via the insulation transfer circuit 81. The pulse signal PSA for switching the state of the transistor circuit 30A on the higher side may be input to the switching circuit 51B from the controller 80.

A power source for driving the drive circuit 40B is connected to the power source voltage terminal 41B. A power source voltage VDDB is applied to the power source voltage terminal 41B and the power source voltage wiring 48 connected to the power source voltage terminal 41B.

A ground having a reference potential VSSB that becomes a reference for the power source voltage VDDB is connected to the ground element 42B. The reference potential VSSB is a potential that becomes a reference when the drive circuit 40B operates. Accordingly, in the drive circuit 40B, the potential of the first ground 91 connected to the ground element 42B becomes the reference potential VSSB.

Figure 3:
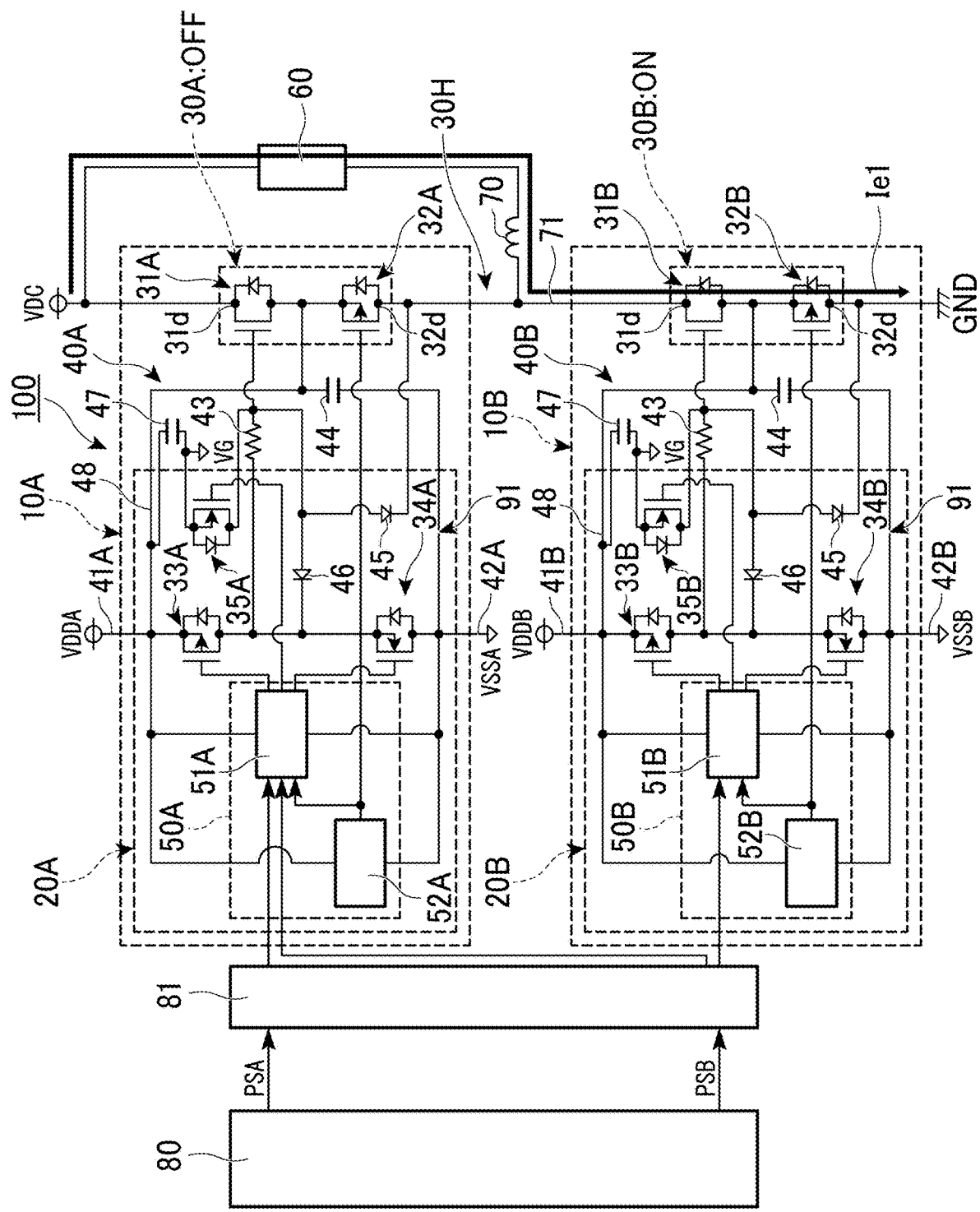
FIG. 3 is a view showing a current flowing in an external load when a transistor circuit in the semiconductor package on a higher side of the first embodiment is in an OFF state and a transistor circuit in the semiconductor package on a lower side is in an ON state.
Figure 4:
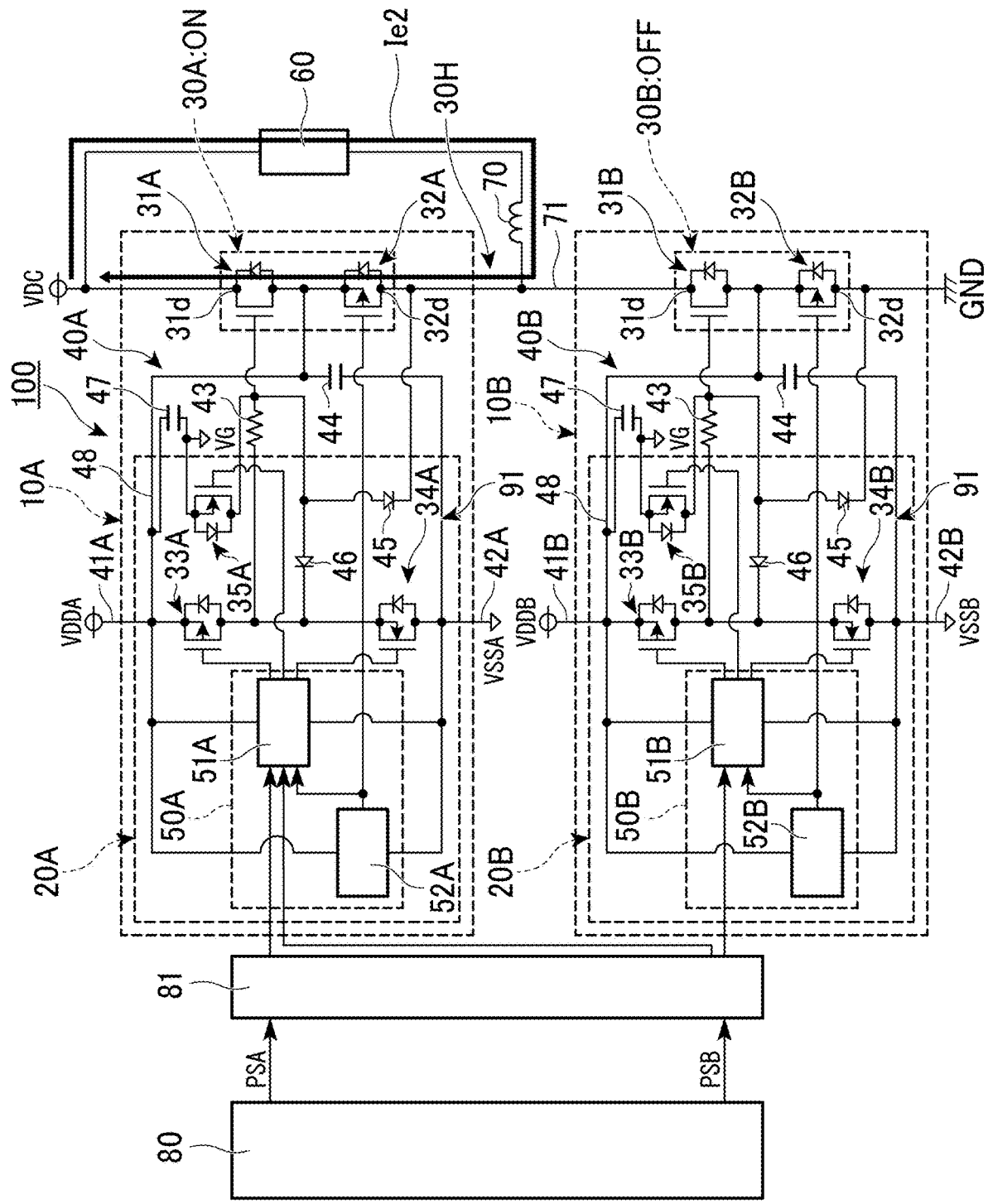
FIG. 4 is a view showing a current flowing in the external load when the transistor circuit in the semiconductor package on the higher side of the first embodiment is in the ON state and the transistor circuit in the semiconductor package on the lower side is in the OFF state.

Next, operation of the semiconductor device 100 will be described. The semiconductor device 100 is controlled on the basis of the pulse signals PSA and PSB input from the controller 80. The semiconductor device 100 is controlled such that the ON/OFF state of the transistor circuit 30A in the semiconductor package 10A on the higher side and the ON/OFF state of the transistor circuit 30B in the semiconductor package 10B on the lower side are switched alternately. FIG. 3 is a view showing a current Ie1 flowing in the external load 60 when the transistor circuit 30A in the semiconductor package 10A on the higher side is in the OFF state and the transistor circuit 30B in the semiconductor package 10B on the lower side is in the ON state. FIG. 4 is a view showing a current Ie2 flowing in the external load 60 when the transistor circuit 30A in the semiconductor package 10A on the higher side is in the ON state and the transistor circuit 30B in the semiconductor package 10B on the lower side is in the OFF state.

As shown in FIG. 3, when the transistor circuit 30A on the higher side is in the OFF state and the transistor circuit 30B on the lower side is in the ON state, the current Ie1 flows from the power source VDC to the ground GND flows. The current Ie1 flows in the external load 60, the coil 70, and the transistor circuit 30B in this order from the power source VDC and flows to the ground GND. In this case, energy is stored in the coil 70.

As shown in FIG. 4, when the transistor circuit 30A on the higher side is in the ON state and the transistor circuit 30B on the lower side is in the OFF state, the current Ie2 circulating in a closed circuit constituted of the external load 60, the coil 70, and the transistor circuit 30A flows. At this time, the current Ie2 flows in the external load 60, the coil 70, and the transistor circuit 30A in this order. In addition, at this time, stored energy is discharged from the coil 70.

Figure 5:
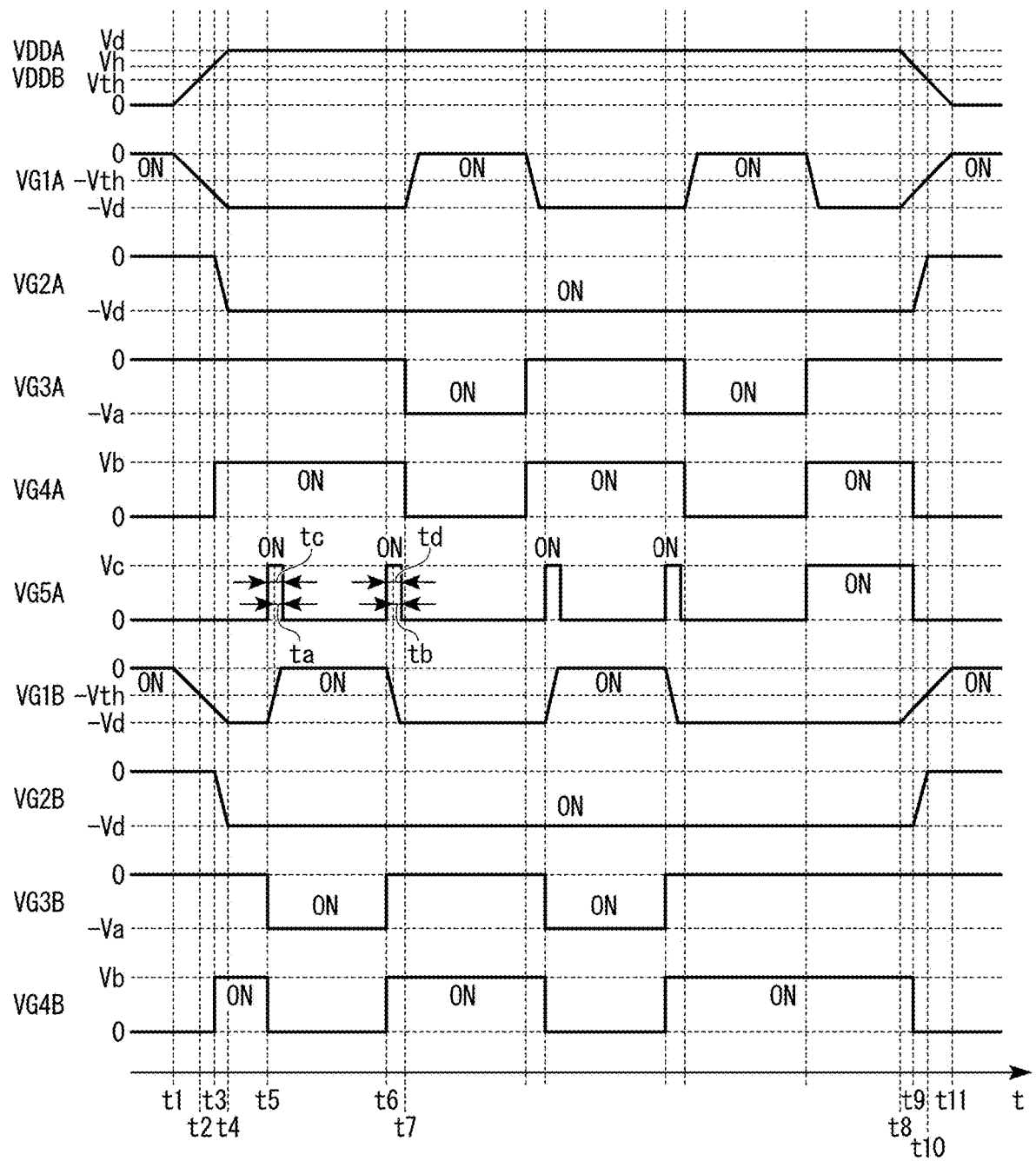
FIG. 5 is a timing chart showing an example of a relationship between power source voltages and gate voltages of respective transistors when the transistor circuits of the first embodiment are switched between the ON state and the OFF state.

FIG. 5 is a timing chart showing an example of a relationship between the power source voltages VDDA and VDDB and the gate voltages of respective transistors when the transistor circuits 30A and 30B are switched between the ON state and the OFF state. In the following description, the power source voltage VDDA and the power source voltage VDDB may be collectively referred to as the power source voltage VDD. In addition, the reference potential VSSA and the reference potential VSSB may be collectively referred to as the reference potential VSS. VG1A is a gate voltage of the first transistor 31A. VG2A is a gate voltage of the second transistor 32A. VG3A is a gate voltage of the third transistor 33A. VG4A is a gate voltage of the fourth transistor 34A. VG5A is a gate voltage of the fifth transistor 35A. VG1B is a gate voltage of the first transistor 31B. VG2B is a gate voltage of the second transistor 32B. VG3B is a gate voltage of the third transistor 33B. VG4B is a gate voltage of the fourth transistor 34B. The gate voltage is a voltage of the gate terminal with respect to the potential of the source terminal. The gate voltage corresponds to "a drive voltage" for driving the field-effect transistor. In the first embodiment, the fifth transistor 35B on the lower side is in the OFF state at all times, and the state is not switched.

The horizontal axis shown in FIG. 5 indicates a time t. FIG. 5 shows an example when the power source of the semiconductor device 100 is turned on at a time t1. When the power source of the semiconductor device 100 is turned off, the potential of the power source voltage wiring 48 becomes the same as the reference potential VSS, and therefore the power source voltage VDD is 0 V. When the power source of the semiconductor device 100 is turned off, the potentials of the gate terminals 31g of the first transistors 31A and 31B are the reference potential VSS, and therefore the potentials of the source terminals 31s of the first transistors 31A and 31B are also the potential of the power source voltage wiring 48, that is, the reference potential VSS. For this reason, when the power source of the semiconductor device 100 is turned off, the normally-on-type first transistors 31A and 31B are in the ON state. When the power source of the semiconductor device 100 is turned off, other normally-off-type transistors are in the OFF state. The circuit may be constituted such that the fourth transistors 34A and 34B are in the ON state when the power source of the semiconductor device 100 is turned off.

If the power source of the semiconductor device 100 is turned on, the power source voltage VDD rises from 0 V to a constant voltage Vd. If the power source voltage VDD rises, the potentials of the source terminals 31s of the first transistors 31A and 31B leading to the power source voltage wiring 48 rise. For this reason, the gate voltages VG1A and VG1B of the first transistors 31A and 31B fall by an amount corresponding to the rise in the potential of the source terminal 31s. The value of the power source voltage VDD becomes the same value as the absolute value Vth of the threshold voltage of the first transistors 31A and 31B at a time t2 later than the time t1. At the time t2, the gate voltages VG1A and VG1B become the threshold voltage of the first transistors 31A and 31B, that is, −Vth. After the time t2, if the gate voltages VG1A and VG1B become lower than −Vth, the first transistors 31A and 31B are in the OFF state. At a time t4 later than the time t2, the power source voltage VDD becomes the constant voltage Vd, and the absolute value of the gate voltages VG1A and VG1B becomes the same negative value as the constant voltage Vd, that is, −Vd.

The voltage comparison circuits 52A and 52B cause the gate voltages VG2A and VG2B to be 0 V by applying the same voltage as that of the source terminal 32s to the gate terminals 32g of the second transistors 32A and 32B and maintain the second transistors 32A and 32B in the OFF state until the power source voltage VDD exceeds the absolute value Vth of the threshold voltage of the first transistors 31A and 31B. In the first embodiment, the voltage comparison circuits 52A and 52B cause the gate voltages VG2A and VG2B to be 0 V by short-circuiting the power source voltage wiring 48 and the gate terminals 32g of the second transistors 32A and 32B until the power source voltage VDD exceeds the absolute value Vth of the threshold voltage of the first transistors 31A and 31B.

If the power source voltage VDD becomes equal to or higher than a value Vh which is higher than the absolute value Vth of the threshold voltage of the first transistors 31A and 31B, the voltage comparison circuits 52A and 52B decrease the voltage applied to the gate terminals 32g of the second transistors 32A and 32B and cause the P channel-type second transistors 32A and 32B to be in the ON state.

In the example of FIG. 5, at a time t3 between the time t2 and the time t4, the power source voltage VDD reaches the value Vh. If the power source voltage VDD becomes equal to or higher than the value Vh, for example, the voltage comparison circuits 52A and 52B connect the gate terminals 32g of the second transistors 32A and 32B to the first ground 91. Accordingly, the gate voltages VG2A and VG2B of the second transistors 32A and 32B fall as much as the absolute value of the power source voltage VDD. If the value of the power source voltage VDD reaches the constant voltage Vd, the values of the gate voltages VG2A and VG2B of the second transistors 32A and 32B become −Vd. The threshold voltage of the second transistors 32A and 32B is a value higher than −Vd. For this reason, in the first embodiment, if the values of the gate voltages VG2A and VG2B become −Vd, the P channel-type second transistors 32A and 32B are in the ON state. In a state in which the power source voltage VDD is the constant voltage Vd, the second transistors 32A and 32B are maintained in the ON state at all times. In this manner, when the voltage of the power source voltage wiring 48 is higher than the absolute value Vth of the threshold voltage of the first transistor 31A, the control circuit 50A causes the second transistor 32A to be in the ON state.

If it is judged that the power source voltage VDD has exceeded the absolute value Vth of the threshold voltage of the first transistors 31A and 31B on the basis of an output from the voltage comparison circuits 52A and 52B, the switching circuits 51A and 51B cause the fourth transistors 34A and 34B to be in the ON state by applying a voltage equal to or higher than the threshold voltage of each transistor to the gate terminals 34g of the fourth transistors 34A and 34B. In the example of FIG. 5, when the power source voltage VDD reaches the value Vh higher than the absolute value Vth at the time t3, the switching circuits 51A and 51B cause the fourth transistors 34A and 34B to be in the ON state by causing the values of the gate voltages VG4A and VG4B of the fourth transistors 34A and 34B to be Vb. The value Vb is not particularly limited as long as it is a value of the gate voltage capable of causing each transistor to be in the ON state. The value Vb may also be the same value as the constant voltage Vd.

If the power source voltage VDD becomes the constant voltage Vd at the time t4, the semiconductor device 100 is in an operable state. At the time t4 when the semiconductor device 100 is in an operable state, the first transistors 31A and 31B, the third transistors 33A and 33B, and the fifth transistor 35A are in the OFF state, and the second transistors 32A and 32B and the fourth transistors 34A and 34B are in the ON state. At the time t4, the same voltage as the power source voltage VDD is applied to the gate terminals 33g of the third transistors 33A and 33B from the switching circuits 51A and 51B. Accordingly, the gate voltages VG3A and VG3B of the third transistors 33A and 33B are 0 V at the time t4, and the normally-off-type third transistors 33A and 33B are in the OFF state. When the third transistors 33A and 33B are caused to be in the OFF state, for example, the switching circuits 51A and 51B short-circuit the gate terminals 33g and the source terminals 33s of the third transistors 33A and 33B via the power source voltage wiring 48.

The transistor circuit 30A, which is regarded as a single normally-off-type transistor, is in the ON state when both the first transistor 31A and the second transistor 32A are in the ON state, and is in the OFF state when at least one of the first transistor 31A and the second transistor 32A is in the OFF state. The same also applies to the transistor circuit 30B. For this reason, at the time t4 when the semiconductor device 100 is in an operable state, each of the transistor circuits 30A and 30B is in the OFF state. Since the second transistors 32A and 32B are in the ON state at all times while the constant voltage Vd is supplied to the semiconductor device 100 and it is in an operable state, each of the transistor circuits 30A and 30B can be turned on and off by turning on and off the states of the first transistors 31A and 31B.

If the semiconductor device 100 is in an operable state, the semiconductor device 100 starts a switching operation of alternately switching the ON/OFF states of the transistor circuit 30A and the transistor circuit 30B on the basis of the pulse signals PSA and PSB input from the controller 80. In the example of FIG. 5, at a time t5 later than the time t4, the pulse signal PSB for causing the transistor circuit 30B on the lower side to be in the ON state is input to the switching circuit 51B on the lower side. In addition, at the time t5, the pulse signal PSB for causing the transistor circuit 30B on the lower side to be in the ON state is also input to the switching circuit 51A on the higher side. The switching circuit 51B causes the third transistor 33B to be in the ON state and causes the fourth transistor 34B to be in the OFF state on the basis of the pulse signal PSB. Specifically, the switching circuit 51B applies a voltage for causing the third transistor 33B to be in the ON state to the gate terminal 33g of the third transistor 33B and applies a voltage for causing the fourth transistor 34B to be in the OFF state to the gate terminal 34g of the fourth transistor 34B. In the example of FIG. 5, at the time t5, the switching circuit 51B causes the third transistor 33B to be in the ON state by causing the value of the gate voltage VG3B of the P channel-type third transistor 33B to be -Va and causes the fourth transistor 34B to be in the OFF state by causing the value of the gate voltage VG4B of the N channel-type fourth transistor 34B to be 0 V.

If the third transistor 33B is in the ON state and the fourth transistor 34B is in the OFF state, the gate terminal 31g of the first transistor 31B is in a state of being short-circuited with respect to the power source voltage wiring 48 via the third transistor 33B, and the gate voltage VG1B of the first transistor 31B becomes 0 V. Accordingly, the first transistor 31B is in the ON state. If the first transistor 31B is in the ON state, the transistor circuit 30B on the lower side is in the ON state, thereby being in a state in which the current Ie1 flows as shown in FIG. 3.

The control circuit 50A of the drive circuit 40A on the higher side switches the fifth transistor 35A in the drive circuit 40A on the higher side between the ON state and the OFF state on the basis of the state of the drive circuit 40B on the lower side. In the first embodiment, if the pulse signal PSB for causing the transistor circuit 30B on the lower side to be in the ON state is input, the switching circuit 51A in the control circuit 50A on the higher side causes the fifth transistor 35A to be in the ON state. Accordingly, in the first embodiment, the control circuit 50A on the higher side causes the fifth transistor 35A to be in the ON state before the first transistor 31B is switched to the ON state. Specifically, the switching circuit 51A applies a voltage for causing the fifth transistor 35A to be in the ON state to the gate terminal 35g of the fifth transistor 35A. In the example of FIG. 5, at the time t5 when the third transistor 33B on the lower side is in the ON state, the switching circuit 51A causes the fifth transistor 35A to be in the ON state by causing the value of the gate voltage VGSA of the N channel-type fifth transistor 35A to be a value Vc. The value Vc is not particularly limited as long as it is a value of the gate voltage capable of causing the fifth transistor 35A to be in the ON state. The value Vc may also be the same value as the constant voltage Vd.

The control circuit 50A on the higher side causes the fifth transistor 35A to be in the OFF state when a first predetermined time ta has elapsed from the point of time when the first transistor 31B on the lower side is in the ON state after the pulse signal PSB for causing the transistor circuit 30B on the lower side to be in the ON state is input and the fifth transistor 35A is caused to be in the ON state. Namely, in the first embodiment, the control circuit 50A of the drive circuit 40A on the higher side causes the fifth transistor 35A in the drive circuit 40A on the higher side to be in the ON state during a period until at least the first predetermined time ta elapses from the point of time when the first transistor 31B in the drive circuit 40B on the lower side is switched from the OFF state to the ON state. The first predetermined time ta is a time equal to or longer than the time until a current Is1 shown in FIG. 6 no longer flows after the first transistor 31B is switched from the OFF state to the ON state. The current Is1 will be described in detail later.

In the first embodiment, the control circuit 50A on the higher side causes the fifth transistor 35A to be in the OFF state when a third predetermined time tc has elapsed from the point of time when the fifth transistor 35A is caused to be in the ON state after the pulse signal PSB for causing the transistor circuit 30B on the lower side to be in the ON state is input. The third predetermined time tc is equal to or longer than the time until the current Is1 shown in FIG. 6 no longer flows after the third transistor 33B is switched from the OFF state to the ON state. The third predetermined time tc is longer than the first predetermined time ta.

If a predetermined time has elapsed after the transistor circuit 30B on the lower side is in the ON state and it becomes a time t6, the pulse signal PSB for instructing the transistor circuit 30B on the lower side to be in the OFF state is input to the switching circuit 51B from the controller 80. At the time t6, the switching circuit 51B causes the third transistor 33B to be in the OFF state and causes the fourth transistor 34B to be in the ON state on the basis of the pulse signal PSB. Accordingly, the first transistor 31B is in the OFF state again, and the transistor circuit 30B is in the OFF state.

In the first embodiment, if the pulse signal PSB for causing the transistor circuit 30B on the lower side to be in the OFF state is input, the switching circuit 51A in the control circuit 50A on the higher side causes the fifth transistor 35A to be in the ON state. Accordingly, in the first embodiment, the control circuit 50A on the higher side causes the fifth transistor 35A to be in the ON state before the first transistor 31B is switched to the OFF state. The control circuit 50A on the higher side causes the fifth transistor 35A to be in the OFF state when a second predetermined time tb has elapsed from when the first transistor 31B on the lower side is in the OFF state after the pulse signal PSB for causing the transistor circuit 30B on the lower side to be in the OFF state is input and the fifth transistor 35A is caused to be in the ON state. Namely, the control circuit 50A on the higher side causes the fifth transistor 35A in the drive circuit 40A on the higher side to be in the ON state during a period until the second predetermined time tb elapses from the point of time when the first transistor 31B in the drive circuit 40B on the lower side is switched from the ON state to the OFF state. The second predetermined time tb is a time equal to or longer than the time until a current Is2 shown in FIG. 7 no longer flows after the first transistor 31B is switched from the ON state to the OFF state. The current Is2 will be described in detail later. The second predetermined time tb is shorter than the time taken until the first transistor 31A on the higher side is in the ON state after the first transistor 31B is switched from the ON state to the OFF state.

In the first embodiment, the control circuit 50A on the higher side causes the fifth transistor 35A to be in the OFF state when a fourth predetermined time td has elapsed from the point of time when the fifth transistor 35A is in the ON state after the pulse signal PSB for causing the transistor circuit 30B on the lower side to be in the OFF state is input. The fourth predetermined time td is equal to or longer than the time until the current Is2 shown in FIG. 7 no longer flows after the third transistor 33B is switched from the ON state to the OFF state. The fourth predetermined time td is longer than the second predetermined time tb.

The controller 80 outputs the pulse signal PSA for causing the transistor circuit 30A on the higher side to be in the ON state at a time t7 after the elapse of a predetermined dead time after the transistor circuit 30B is caused to be in the OFF state at the time t6. The pulse signal PSA is input to the switching circuit 51A on the higher side, and the switching circuit 51A, similar to the switching circuit 51B described above, causes the transistor circuit 30A on the higher side to be in the ON state. Accordingly, the current Ie2 is in a flowing state as shown in FIG. 4. Thereafter, similarly, the state of the transistor circuit 30A and the state of the transistor circuit 30B are switched alternately.

If the power source of the semiconductor device 100 is turned off, the power source voltage VDD decreases to 0 V from the constant voltage Vd. The example of FIG. 5 shows a case in which the power source of the semiconductor device 100 is turned off at a time t8. If the power source of the semiconductor device 100 is turned off, the power source voltage VDD falls, and the gate voltages VG1A and VG1B of the first transistors 31A and 31B rise by an amount corresponding to the fall in the power source voltage VDD. If the value of the power source voltage VDD reaches the value Vh higher than the absolute value Vth of the threshold voltage of the first transistors 31A and 31B at a time t9 later than the time t8, the voltage comparison circuits 52A and 52B cause the voltage applied to the gate terminals 32g of the second transistors 32A and 32B to be a voltage for causing the second transistors 32A and 32B to be in the OFF state. For example, the voltage comparison circuits 52A and 52B cause the second transistors 32A and 32B to be in the OFF state by short-circuiting the gate terminal 32g and the source terminal 32s via the power source voltage wiring 48 and causing the gate voltages VG2A and VG2B of the second transistors 32A and 32B to be 0 V. When the power source of the semiconductor device 100 is turned off, the second transistors 32A and 32B cause the second transistors 32A and 32B to be in the OFF state before the power source voltage VDD reaches the absolute value Vth of the threshold voltage of the first transistors 31A and 31B.

As described above, the control circuits 50A and 50B cause the second transistors 32A and 32B to be in the ON state after the power source voltage VDD has exceeded the absolute value Vth of the threshold voltage of the first transistors 31A and 31B when the power source of the semiconductor device 100 is turned on, and cause the second transistors 32A and 32B to be in the OFF state before the power source voltage VDD becomes equal to or lower than the absolute value Vth of the threshold voltage of the first transistors 31A and 31B when the power source of the semiconductor device 100 is turned off. Accordingly, when the power source of the semiconductor device 100 is turned on and when the power source of the semiconductor device 100 is turned off, the transistor circuits 30A and 30B are not in the ON state so that a current can be prevented from unintentionally flowing in the external load 60.

When the power source of the semiconductor device 100 is turned off, if the power source voltage VDD decreases and reaches the value Vh, the switching circuits 51A and 51B cause the fourth transistors 34A and 34B to be in the OFF state. At this time, the switching circuits 51A and 51B may maintain the fourth transistors 34A and 34B in the ON state.

At a time t10 later than the time t9, the power source voltage VDD falls to the absolute value Vth of the threshold voltage of the first transistors 31A and 31B. If the power source voltage VDD becomes equal to or lower than the absolute value Vth of the threshold voltage of the first transistors 31A and 31B, the gate voltages VG1A and VG1B of the first transistors 31A and 31B become equal to or higher than the threshold voltage, and the first transistors 31A and 31B are in the ON state. As described above, since the second transistors 32A and 32B are in the OFF state before the power source voltage VDD reaches the absolute value Vth, even if the first transistors 31A and 31B are in the ON state, the transistor circuits 30A and 30B are maintained in the OFF state. If the power source voltage VDD becomes 0 V at a time t11, the semiconductor device 100 stops.

Figure 6:
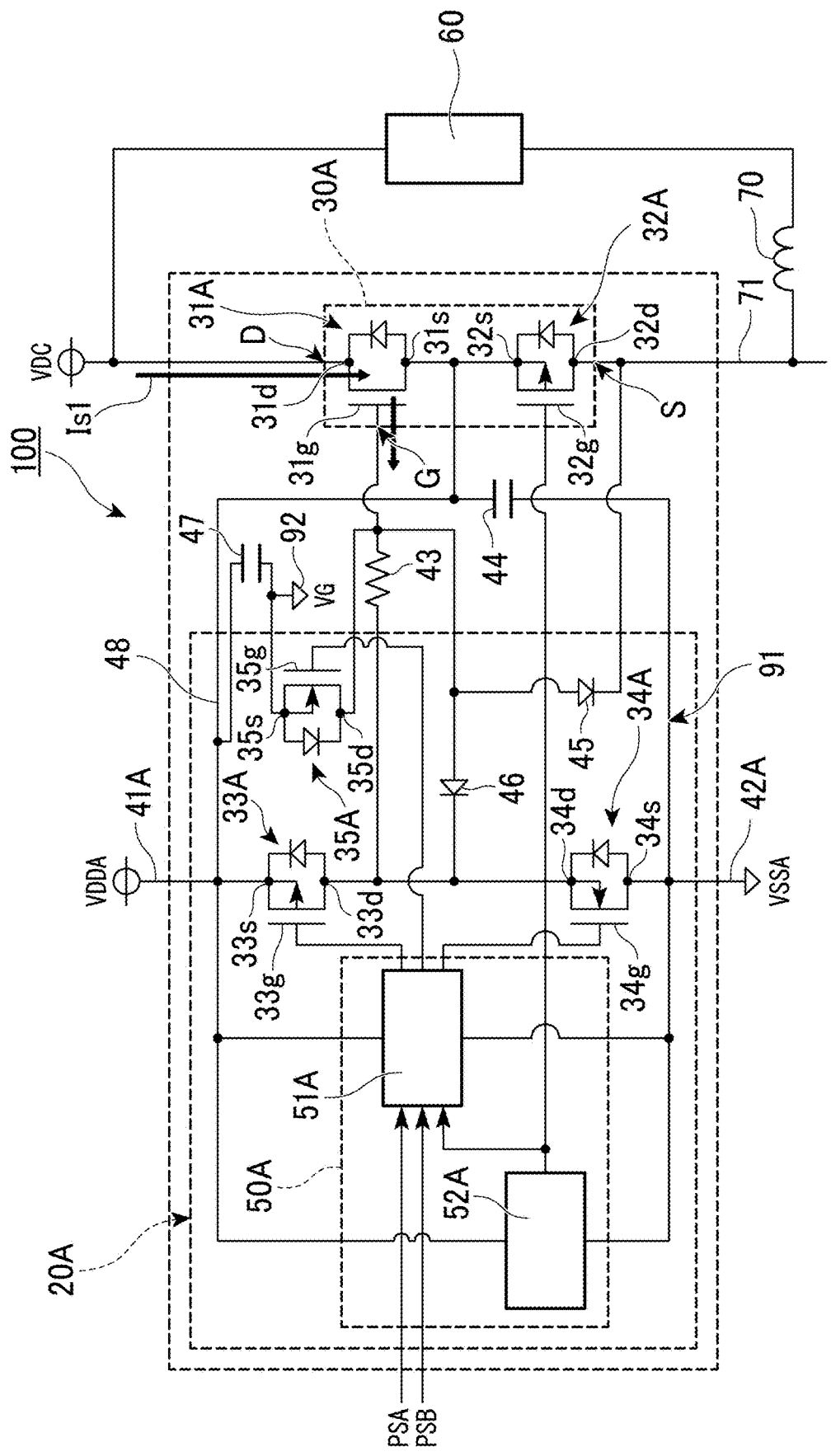
FIG. 6 is a view showing a current flowing when the transistor circuit on the higher side of the first embodiment is in the OFF state and the transistor circuit on the lower side is switched from the OFF state to the ON state.

Next, the current Is1 flowing when the transistor circuit 30A on the higher side is in the OFF state and the transistor circuit 30B on the lower side is switched from the OFF state to the ON state while the semiconductor device 100 is in switching operation will be described. FIG. 6 is a view showing the current Is1 flowing when the transistor circuit 30A on the higher side is in the OFF state and the transistor circuit 30B on the lower side is switched from the OFF state to the ON state.

As shown in FIG. 6, if the transistor circuit 30B on the lower side is switched to the ON state, the current Is1 flows from the drain terminal D of the transistor circuit 30A to the first transistor 31A. The current Is1 flows from the drain terminal 31d of the first transistor 31A to the gate terminal 31g of the first transistor 31A via a gate-drain capacitance of the first transistor 31A. For example, the current Is1 which has flowed to the gate terminal 31g flows in the first diode 45 and flows to the source terminal S of the transistor circuit 30A, that is, the drain terminal 32d of the second transistor 32A. For example, the current Is1 is generated during a period until the gate-drain capacitance of the first transistor 31A is charged.

Figure 15:
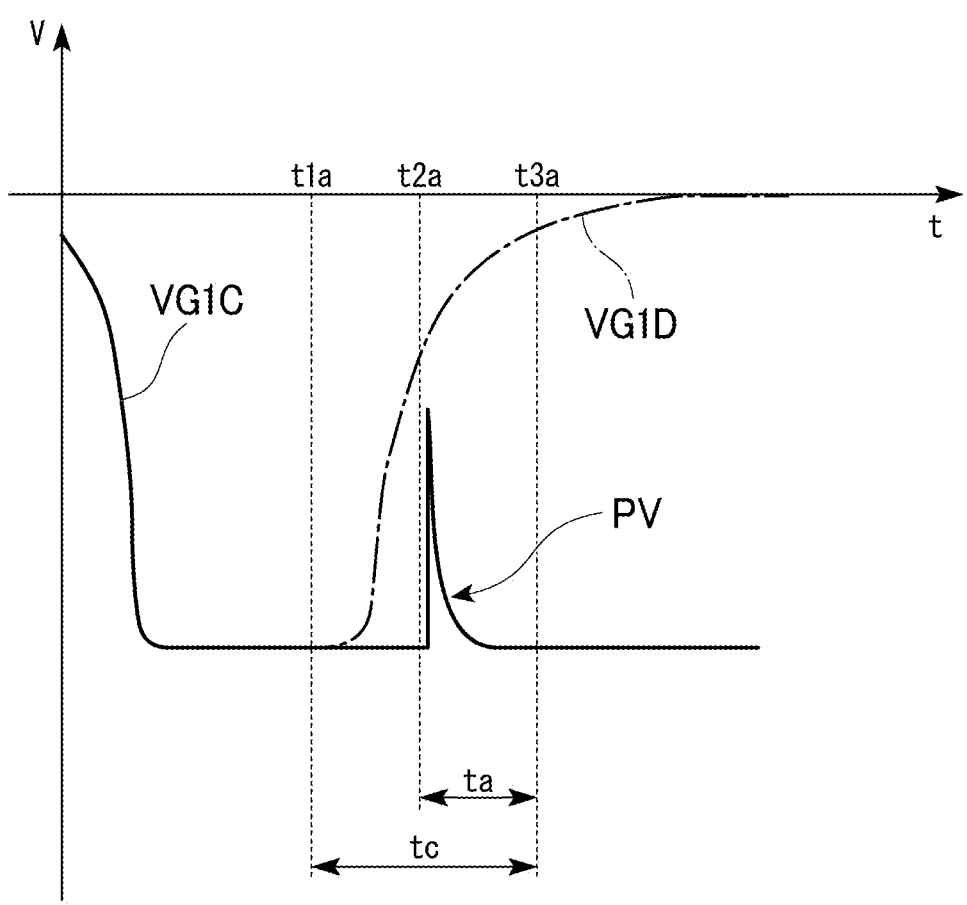
FIG. 15 is a graph showing an example of an induced voltage generated in a semiconductor device of a comparative example.

In the drive circuits in the related art, if the current Is1 flows in the gate terminal 31g, charge accumulates in the gate terminal 31g, and the gate voltage VG1A of the first transistor 31A rises. For this reason, an induced voltage PV causing the gate voltage VG1A to rise in a positive direction may be generated in the gate voltage VG1A of the first transistor 31A. FIG. 15 is a graph showing an example of the induced voltage PV generated in a semiconductor device of a comparative example in which the fifth transistor 35A and the second capacitor 47 are not provided. VG1C indicated by a solid line in FIG. 15 is a gate voltage in the first transistor on the higher side of the comparative example. VG1D indicated by a one-dot dashed line in FIG. 15 is a gate voltage in the first transistor on the lower side of the comparative example. As shown in FIG. 15, in the comparative example, if the gate voltage VG1D of the first transistor on the lower side rises and the first transistor on the lower side is in the ON state, the induced voltage PV causing the gate voltage VG1C of the first transistor on the higher side to instantaneously rise is generated. In the example of FIG. 15, at a time t1a, the third transistor on the lower side is in the ON state, and the gate voltage VG1D starts to rise. At a time t2a later than the time t1a, the first transistor on the lower side is in the ON state.

In the first embodiment, when the third transistor 33B on the lower side is caused to be in the ON state, the fifth transistor 35A on the higher side is caused to be in the ON state, and the fifth transistor 35A is maintained in the ON state at the third predetermined time tc. As described above, the third predetermined time tc is a time equal to or longer than the time until the current Is1 shown in FIG. 6 no longer flows after the third transistor 33B is switched from the OFF state to the ON state. For this reason, in the comparative example, after the current Is1 flows and the induced voltage PV is generated, during a period until the induced voltage PV disappears, the fifth transistor 35A is caused to be in the ON state. Due to the fifth transistor 35A in the ON state, the gate terminal 31g of the first transistor 31A and the second ground 92 can be short-circuited via the fifth transistor 35A, and a rise in voltage of the gate terminal 31g of the first transistor 31A can be curbed. Accordingly, generation of the induced voltage PV in the gate voltage VG1A of the first transistor 31A is curbed. In the example of FIG. 15, the fifth transistor 35A is caused to be in the ON state at the time t1a, and the fifth transistor 35A is caused to be in the OFF state at a time t3a later than the time t2a by the first predetermined time ta.

Figure 7:
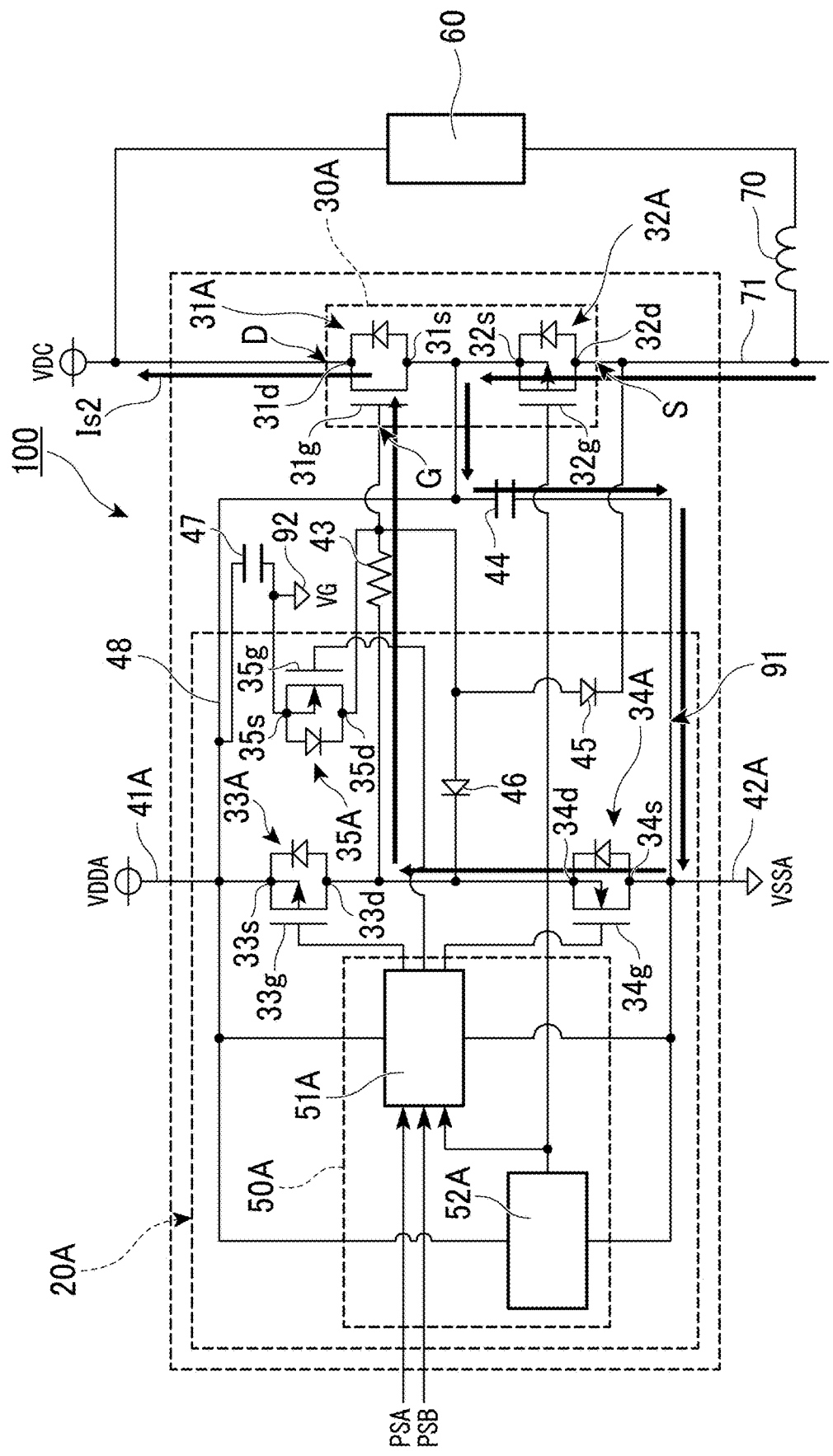
FIG. 7 is a view showing a current flowing when the transistor circuit on the higher side of the first embodiment is in the OFF state and the transistor circuit on the lower side is switched from the ON state to the OFF state.

Next, the current Is2 flowing when the transistor circuit 30A on the higher side is in the OFF state and the transistor circuit 30B on the lower side is switched from the ON state to the OFF state while the semiconductor device 100 is in switching operation will be described. FIG. 7 is a view showing the current Is2 flowing when the transistor circuit 30A on the higher side is in the OFF state and the transistor circuit 30B on the lower side is switched from the ON state to the OFF state.

As shown in FIG. 7, if the transistor circuit 30B on the lower side is switched to the OFF state, the current Is2 flows from the source terminal S of the transistor circuit 30A to the second transistor 32A. The current Is2 flows from the drain terminal 32d of the second transistor 32A to the source terminal 32s. The current Is2 which has flowed in the second transistor 32A flows in the first capacitor 44, the fourth transistor 34A, the resistive element 43, and the gate-drain capacitance of the first transistor 31A in this order from the source terminal 32s and flows to the drain terminal D of the transistor circuit 30A. The current Is2 is generated during a period until the first capacitor 44 and the gate-drain capacitance of the first transistor 31A are charged.

During a period before the first capacitor 44 is charged by the voltage applied between the drain terminal D and the source terminal S, a potential difference occurs between the electrodes of the first capacitor 44, and the current Is2 flows in the first capacitor 44.

Figure 16:
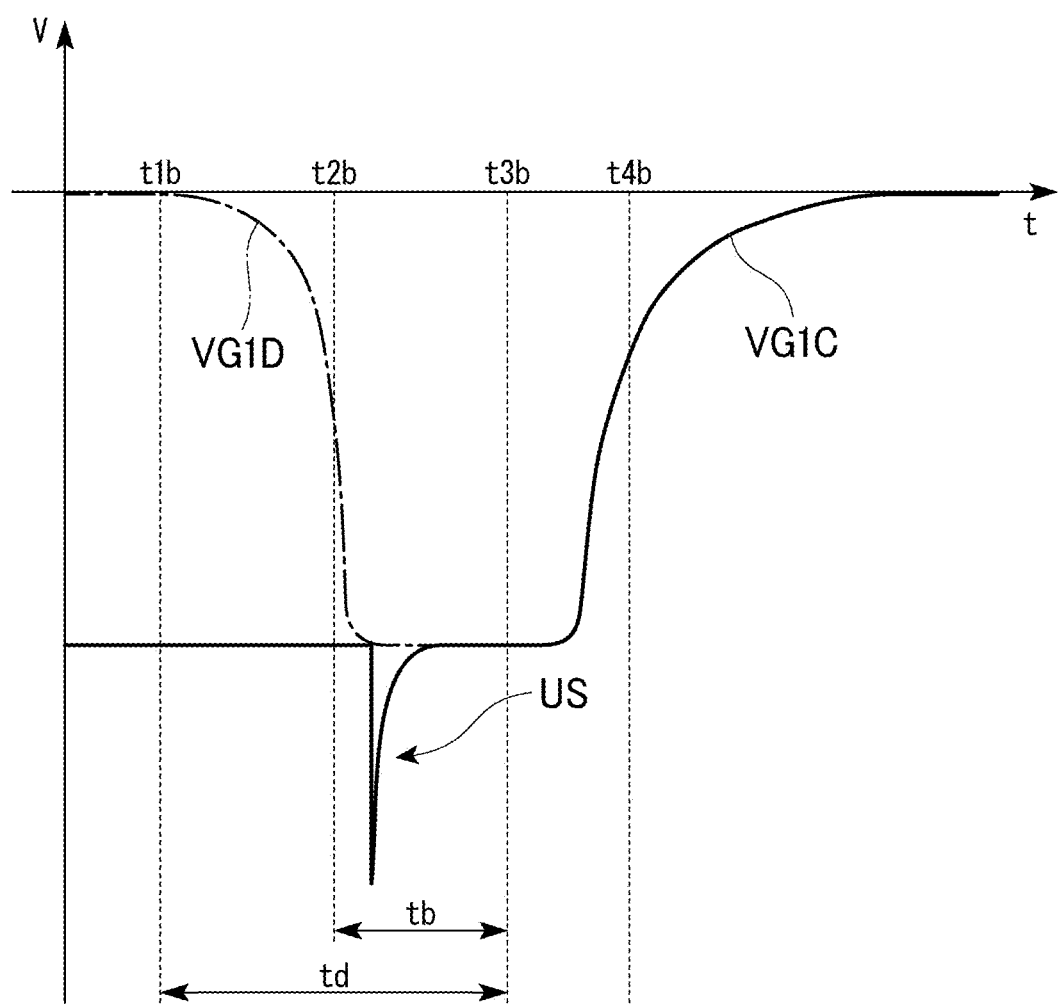
FIG. 16 is a graph showing an example of undershooting occurring in the semiconductor device of the comparative example.

In the drive circuits in the related art, if the current Is2 flows in the resistive element 43, the voltage may fall, and undershooting US may occur in the voltage of the gate terminal 31g of the first transistor 31A. FIG. 16 is a graph showing an example of the undershooting US occurring in the semiconductor device of the comparative example in which the fifth transistor 35A and the second capacitor 47 are not provided. As shown in FIG. 16, in the comparative example, after the gate voltage VG1D of the first transistor on the lower side has fallen and the first transistor on the lower side has been in the OFF state, the undershooting US in which the gate voltage VG1C of the transistor circuit on the higher side instantaneously falls occurs. In the example of FIG. 16, the third transistor on the lower side is in the OFF state at a time t1b, and the gate voltage VG1D starts to fall.

At a time t2b later than the time t1b, the first transistor on the lower side is in the OFF state.

In the first embodiment, when the third transistor 33B on the lower side is caused to be in the OFF state, the fifth transistor 35A on the higher side is caused to be in the ON state, and the fifth transistor 35A is maintained in the ON state at the fourth predetermined time td. As described above, the fourth predetermined time td is a time equal to or longer than the time until the current Is2 shown in FIG. 7 no longer flows after the third transistor 33B is switched from the ON state to the OFF state. For this reason, in the comparative example, after the current Is2 has flowed and the undershooting US has occurred, during a period until the undershooting US disappears, the fifth transistor 35A is caused to be in the ON state. Due to the fifth transistor 35A is in the ON state, the gate terminal 31g of the first transistor 31A and the second ground 92 can be short-circuited via the fifth transistor 35A, and a fall in voltage of the gate terminal 31g of the first transistor 31A can be curbed. Accordingly, the occurrence of the undershooting US is curbed.

In the example of FIG. 16, the fifth transistor 35A is caused to be in the ON state at the time t1b, the fifth transistor 35A is caused to be in the OFF state at a time t3b later than the time t2b by the second predetermined time tb. The time t3b is a time before the pulse signal PSA is input to the control circuit 50A on the higher side and the third transistor 33A on the higher side is caused to be in the ON state. Namely, in the first embodiment, the control circuit 50A of the drive circuit 40A on the higher side causes the fifth transistor 35A to be in the OFF state before starting control for causing the first transistor 31A in the drive circuit 40A on the higher side to be in the ON state after the first transistor 31B in the drive circuit 40B on the lower side is switched from the ON state to the OFF state. At a time t4b later than the time t3b, the first transistor 31A is in the ON state.

In the related art, in order to curb such undershooting US described above, a technology in which a Zener diode is disposed between a power source voltage wiring and a gate terminal of a first transistor is known. In this case, the anode of the Zener diode is connected to the gate terminal of the first transistor. The cathode of the Zener diode is connected to the power source voltage wiring. However, there is a limit to a reaction time of the Zener diode, and there is a limit to the effect of curbing undershooting by the Zener diode. Therefore, there is a problem in that the undershooting US occurring in the gate voltage of the first transistor on the higher side cannot be sufficiently curbed. In addition, even if such a Zener diode described above is provided, there is a problem in that the induced voltage PV generated in the gate voltage of the first transistor cannot be curbed.

Regarding the foregoing problems, according to the first embodiment, the drive circuit 40A is a drive circuit that normally-off drives the transistor circuit 30A constituted of the normally-on-type first transistor 31A and the normally-off-type second transistor 32A which are connected in series. The drive circuit 40A includes the fifth transistor 35A (clamping transistor) that is disposed between the power source voltage wiring 48 (wiring) connected between the first transistor 31A and the second transistor 32A and the gate terminal 31g (drive terminal) of the first transistor 31A and functions as the clamping element, and the second capacitor 47 that is disposed between the fifth transistor 35A and the power source voltage wiring 48 and is connected to the fifth transistor 35A in series. For this reason, even if the current Is2 flows in the resistive element 43 as described above by causing the fifth transistor 35A to be in the ON state at the timing when the undershooting US occurs, a fall in voltage of the gate terminal 31g can be curbed. Therefore, the occurrence of the undershooting US in the gate voltage VG1A (drive voltage) of the first transistor 31A can be curbed. In addition, even if the current Is1 flows as described above, a rise in voltage of the gate terminal 31g can be curbed by causing the fifth transistor 35A to be in the ON state at the timing when the induced voltage PV is generated. Therefore, generation of the induced voltage PV in the gate voltage VG1A of the first transistor 31A can be curbed.

In addition, for instance, if the first transistor 31A is a normally-off-type transistor, even though the second capacitor 47 is not provided, the occurrence of the undershooting US and generation of the induced voltage PV can be curbed similarly to that described above. However, when the first transistor 31A is a normally-on-type transistor as in the first embodiment, if the second capacitor 47 is not provided, there is a problem in that the gate terminal 31g of the first transistor 31A and the source terminal 31s are short-circuited via the fifth transistor 35A and the normally-on-type first transistor 31A is in the ON state. For this reason, in the transistor circuit 30A constituted of the normally-on-type first transistor 31A and the normally-off-type second transistor 32A which are connected in series, the occurrence of the undershooting US and generation of the induced voltage PV cannot be curbed by simply providing the fifth transistor 35A. In contrast, in the first embodiment, the second capacitor 47 connected to the fifth transistor 35A in series is provided between the fifth transistor 35A and the power source voltage wiring 48, and therefore a short circuit between the gate terminal 31g of the first transistor 31A and the source terminal 31s via the fifth transistor 35A is curbed. Accordingly, in the transistor circuit 30A constituted of the normally-on-type first transistor 31A and the normally-off-type second transistor 32A which are connected in series, the occurrence of the undershooting US and generation of the induced voltage PV can be curbed using the fifth transistor 35A.

In addition, when the fifth transistor 35A is disposed between the fifth transistor 35A and the power source voltage wiring 48 without providing the second capacitor 47, the source terminal 35s of the fifth transistor 35A is connected to the power source voltage wiring 48. For this reason, in order to cause the fifth transistor 35A to be in the ON state, there is a need to apply a voltage higher than the power source voltage VDD to the gate terminal 35g. In addition, since the voltage of the source terminal 35s becomes the power source voltage VDD, there is also a problem in that the current flows backward in the fifth transistor 35A when the fifth transistor 35A is caused to be in the ON state so that the voltage of the gate terminal 31g of the first transistor 31A rises. In contrast, according to the first embodiment, by providing the second capacitor 47, the voltage of the source terminal 35s of the fifth transistor 35A can be caused to be lower than the power source voltage VDD, and therefore the occurrence of the problems described above can be curbed.

According to the first embodiment, the electrostatic capacitance of the second capacitor 47 is equal to or larger than ten times the input capacitance Ciss of the first transistor 31A. For this reason, when the current Is1 described above flows and the voltage of the gate terminal 31g is about to rise, charge can be preferably released from the gate terminal 31g of the first transistor 31A to the second capacitor 47. In addition, when the current Is2 described above flows and the voltage of the gate terminal 31g is about to fall, charge can be preferably caused to flow from the second capacitor 47 to the gate terminal 31g. Consequently, when the currents Is1 and Is2 flow, fluctuation of the gate voltage VG1A of the first transistor 31A can be preferably curbed, and the occurrence of the undershooting US and generation of the induced voltage PV in the gate voltage VG1A can be curbed. This effect can be obtained in a remarkably useful manner when the electrostatic capacitance of the second capacitor 47 is equal to or larger than ten times the input capacitance Ciss of the first transistor 31A, compared to when the electrostatic capacitance of the second capacitor 47 is smaller than ten times the input capacitance Ciss of the first transistor 31A. The numerical value, such as ten times, is a numerical value confirmed through a simulation. The occurrence of the undershooting US and generation of the induced voltage PV in the gate voltage VG1A of the first transistor 31A can be more favorably curbed by setting the electrostatic capacitance of the second capacitor 47 to approximately 100 times the input capacitance Ciss of the first transistor 31A.

According to the first embodiment, the output capacitance Coss of the fifth transistor 35A (clamping transistor) is equal to or smaller than one tenth of the input capacitance Ciss of the first transistor 31A. For this reason, the electrostatic capacitance of the fifth transistor 35A in the case of the OFF state can be preferably reduced, and the total electrostatic capacitance of the fifth transistor 35A and the second capacitor 47 which are connected in series can be preferably reduced. Accordingly, when the first transistor 31A is caused to be in the ON state, the amount of charge required to charge the fifth transistor 35A and the second capacitor 47 which are connected in series can be sufficiently reduced compared to the amount of charge for charging the gate terminal 31g so as to cause the first transistor 31A to be in the ON state. Therefore, an increase in time taken until the first transistor 31A is in the ON state can be curbed. In addition, similarly, an increase in time taken until the first transistor 31A is in the OFF state can be curbed. For this reason, even if the fifth transistor 35A and the second capacitor 47 are provided, a decrease in speed of a switching operation can be curbed. This effect can be obtained in a remarkably useful manner when the output capacitance Coss of the fifth transistor 35A is equal to or smaller than one tenth of the input capacitance Ciss of the first transistor 31A, compared to when the output capacitance Coss of the fifth transistor 35A is larger than one tenth of the input capacitance Ciss of the first transistor 31A. The numerical value, such as one tenth, is a numerical value confirmed through a simulation.

According to the first embodiment, the wiring connected between the first transistor 31A and the second transistor 32A is the power source voltage wiring 48 for applying the power source voltage VDD. For this reason, the power source voltage VDD can be applied to the source terminal 31s of the first transistor 31A. Accordingly, a change in the gate voltage VG1A of the first transistor 31A can be detected by detecting a change in the power source voltage VDD. Therefore, a change in ON/OFF state of the first transistor 31A can be detected by detecting a change in the power source voltage VDD, and the state of the second transistor 32A can be easily switched with respect to the change in state of the first transistor 31A. Specifically, as described above, the second transistor 32A can be caused to be in the ON state after the first transistor 31A is in the OFF state when the power source voltage VDD rises. In addition, the second transistor 32A can be caused to be in the OFF state before the first transistor 31A is in the ON state when the power source voltage VDD falls.

According to the first embodiment, the drive circuit 40A includes the third transistor 33A that is disposed between the power source voltage wiring 48 and the gate terminal 31g (drive terminal) of the first transistor 31A, the fourth transistor 34A that is disposed between the first ground 91 and the gate terminal 31g of the first transistor 31A, and the control circuit 50A that switches each of the second transistor 32A, the third transistor 33A, the fourth transistor 34A, and the fifth transistor 35A (clamping transistor) between the ON state and the OFF state. For this reason, the state of the transistor circuit 30A can be switched by the control circuit 50A switching each state of the second transistor 32A, the third transistor 33A, and the fourth transistor 34A. In addition, the occurrence of the undershooting US and generation of the induced voltage PV can be curbed as described above by the control circuit 50A switching the state of the fifth transistor 35A to the ON state. In addition, at the timing when the undershooting US does not occur and the induced voltage PV is not generated, the parasitic capacitance of the fifth transistor 35A can be reduced by the control circuit 50A switching the state of the fifth transistor 35A to the OFF state. Accordingly, the total electrostatic capacitance of the fifth transistor 35A and the second capacitor 47 which are connected in series can be reduced. Therefore, even if the second capacitor 47 is provided, an increase in time taken until the gate terminal 31g of the first transistor 31A is charged can be curbed.

According to the first embodiment, the source terminal 35s (output terminal) of the fifth transistor 35A (clamping transistor) is connected to the second ground 92 which is provided separately from the first ground 91. For this reason, when a voltage is applied between the drain terminal D and the source terminal S of the transistor circuit 30A on the higher side before the power source of the semiconductor device 100 is turned on, even if a current which has flowed in the first transistor 31A flows from the source terminal 31s to the first ground 91 through the first capacitor 44, a flow from the first ground 91 to the second ground 92 can be curbed. Accordingly, a flow of the current from the second ground 92 to the body diode of the fifth transistor 35A can be curbed, and the current can be caused to flow in the body diode of the fourth transistor 34A, the resistive element 43, and the first diode 45 in this order from the first ground 91. Therefore, the magnitude of the current can be reduced by the resistive element 43, and generation of an inrush current can be curbed. In addition, when the first ground 91 and the second ground 92 are connected by an element having a relatively high impedance, the current flows from the first ground 91 to the second ground 92 so that the magnitude of the current can be reduced. For this reason, generation of an inrush current can be curbed.

According to the first embodiment, the control circuit 50A has the voltage comparison circuit 52A switching the state of the second transistor 32A on the basis of the result of comparison between the power source voltage VDD and the absolute value Vth of the threshold voltage of the first transistor 31A. The fifth transistor 35A (clamping transistor) and the voltage comparison circuit 52A are mounted on the same semiconductor chip 20A. For this reason, compared to when the fifth transistor 35A and the voltage comparison circuit 52A are mounted on separate semiconductor chips, the wiring length of the circuit part including the fifth transistor 35A and the voltage comparison circuit 52A can be shortened, and the impedance of the circuit part can be decreased.

According to the first embodiment, the fifth transistor 35A (clamping transistor), the third transistor 33A, the fourth transistor 34A, and the control circuit 50A are mounted on the same semiconductor chip 20A. For this reason, compared to when the fifth transistor 35A (clamping transistor), the third transistor 33A, the fourth transistor 34A, and the control circuit 50A are mounted on separate semiconductor chips, the wiring length of the circuit part including these parts can be shortened, and the impedance of the circuit part can be more preferably decreased.

According to the first embodiment, the semiconductor device 100 includes the two drive circuits 40A and 40B, and the two transistor circuits 30A and 30B that are normally-off driven by the drive circuits 40A and 40B. The two drive circuits 40A and 40B respectively drive the two transistor circuits 30A and 30B. The two transistor circuits 30A and 30B are connected to each other in series and constitute the half-bridge circuit 30H. The control circuit 50A of the drive circuit 40A on one side switches the fifth transistor 35A (clamping transistor) in the drive circuit 40A on one side between the ON state and the OFF state on the basis of the state of the drive circuit 40B on the other side. For this reason, when the drive circuit 40B on the other side causes the transistor circuit 30B to be in the ON state and causes the transistor circuit 30B to be in the OFF state, the fifth transistor 35A can be caused to be in the ON state by the drive circuit 40A on one side. Accordingly, a change in the gate voltage VG1A of the first transistor 31A can be curbed, and the occurrence of the undershooting US and generation of the induced voltage PV in the gate voltage VG1A of the first transistor 31A can be curbed.

According to the first embodiment, the control circuit 50A of the drive circuit 40A on one side causes the fifth transistor 35A (clamping transistor) in the drive circuit 40A on one side to be in the ON state during a period until at least the first predetermined time ta elapses from the point of time when the first transistor 31B in the drive circuit 40B on the other side is switched from the OFF state to the ON state. For this reason, by appropriately setting the first predetermined time ta, the fifth transistor 35A can be caused to be in the ON state at the timing when the induced voltage PV is generated after the first transistor 31B is in the ON state. Accordingly, generation of the induced voltage PV in the gate voltage VG1A of the first transistor 31A can be further curbed.

According to the first embodiment, the control circuit 50A of the drive circuit 40A on one side causes the fifth transistor 35A (clamping transistor) in the drive circuit 40A on one side to be in the ON state during a period until at least the second predetermined time tb elapses from the point of time when the first transistor 31B in the drive circuit 40B on the other side is switched from the ON state to the OFF state. For this reason, by appropriately setting the second predetermined time tb, the fifth transistor 35A can be caused to be in the ON state at the timing when the undershooting US occurs after the first transistor 31B is in the OFF state. Accordingly, the occurrence of the undershooting US in the gate voltage VG1A of the first transistor 31A can be further curbed. In addition, the control circuit 50A of the drive circuit 40A on one side causes the fifth transistor 35A to be in the OFF state before starting control for causing the first transistor 31A in the drive circuit 40A on one side to be in the ON state after the first transistor 31B in the drive circuit 40B on the other side is switched from the ON state to the OFF state. For this reason, when it is intended for the drive circuit 40A to cause the third transistor 33A to be in the ON state and cause the first transistor 31A to be in the ON state on the basis of the pulse signal PSA, the fifth transistor 35A is in the OFF state. Accordingly, when it is intended to cause the first transistor 31A to be in the ON state, the total electrostatic capacitance of the fifth transistor 35A and the second capacitor 47 which are connected in series can be reduced, and therefore an increase in time taken until the first transistor 31A is in the ON state can be curbed.

According to the first embodiment, the control circuit 50A of the drive circuit 40A on one side causes the fifth transistor 35A (clamping transistor) to be in the OFF state when the second predetermined time tb has elapsed from the point of time when the first transistor 31B in the drive circuit 40B on the other side is switched from the ON state to the OFF state. For this reason, by appropriately setting the second predetermined time tb, the fifth transistor 35A can be caused to be in the OFF state before starting control for causing the first transistor 31A to be in the ON state after the timing when the undershooting US occurs has elapsed.

According to the first embodiment, the semiconductor device 100 includes the half-bridge circuit 30H having a constitution in which the two transistor circuits 30A and 30B are connected to each other in series. For this reason, even when a worker who manufactures a circuit using the semiconductor device 100 uses any transistor circuit of the transistor circuit 30A and the transistor circuit 30B as the transistor circuit on the higher side, the occurrence of the undershooting US and generation of the induced voltage PV in the gate voltage VG1A of the first transistor 31A can be curbed as described above. In addition, even in a circuit in which the transistor circuit 30A and the transistor circuit 30B are switched between the higher side and the lower side, even when any of the transistor circuits 30A and 30B serve as the transistor circuit on the higher side, the occurrence of the undershooting US and generation of the induced voltage PV in the gate voltage VGA of the first transistor 31A can be curbed as described above.

In the present disclosure, regarding the expression "the control circuit 50A causes a certain fifth transistor 35A to be in the ON state from a certain point of time to a different point of time", the control circuit 50A need only cause the fifth transistor 35A to be in the ON state during a period from a certain point of time to a different point of time, and the state of the fifth transistor 35A before the certain point of time and after the different point of time is not particularly limited.

Second Embodiment

A second embodiment differs from the first embodiment in the control procedure in the control circuit 50A. In the following description, the same reference signs are suitably applied to constitutions similar to those in the embodiment described above, and description may be omitted.

Figure 8:
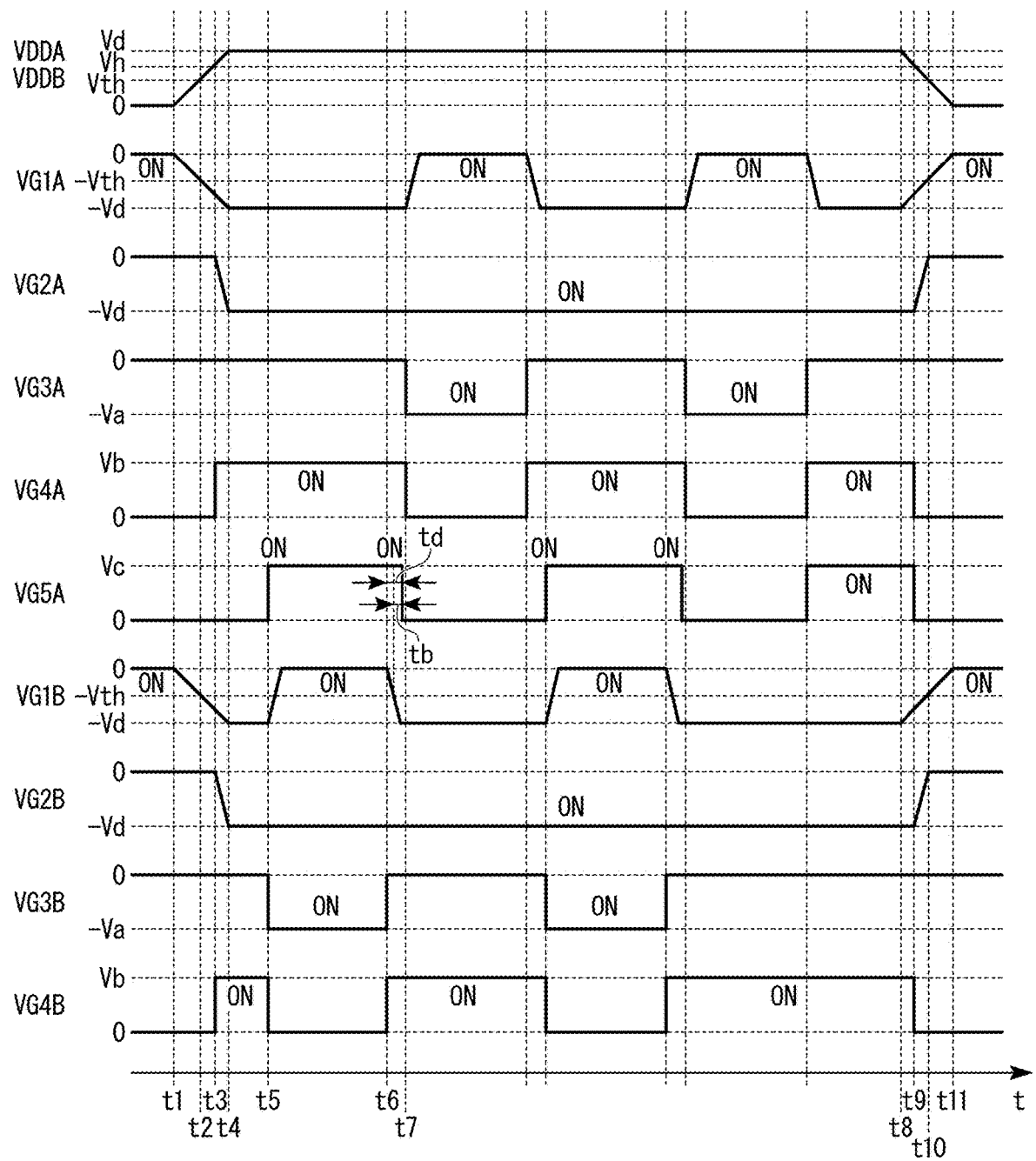
FIG. 8 is a timing chart showing an example of a relationship between the power source voltages and the gate voltages of the respective transistors when the transistor circuits of a second embodiment are switched between the ON state and the OFF state.

FIG. 8 is a timing chart showing an example of a relationship between the power source voltages VDD and the gate voltages of the respective transistors when the transistor circuits 30A and 30B of the second embodiment are switched between the ON state and the OFF state. As shown in FIG. 8, in the second embodiment, the control circuit 50A of the drive circuit 40A on the higher side causes the fifth transistor 35A to be in the ON state at the time t5 when the third transistor 33B on the lower side is caused to be in the ON state and maintains the fifth transistor 35A in the ON state while the third transistor 33B is in the ON state. The control circuit 50A causes the fifth transistor 35A to be in the OFF state when the fourth predetermined time td has elapsed after the third transistor 33B is caused to be in the OFF state. Similar to the first embodiment, the control circuit 50A causes the fifth transistor 35A to be in the OFF state when the second predetermined time tb has elapsed from the point of time when the first transistor 31B is in the OFF state after the third transistor 33B is in the OFF state. Other control procedures of the control circuit 50A according to the second embodiment are similar to other control procedures of the control circuit 50A according to the first embodiment.

According to the second embodiment, the control circuit 50A of the drive circuit 40A on one side causes the fifth transistor 35A (clamping transistor) in the drive circuit 40A on one side to be in the ON state during a period until the first transistor 31B is switched to the OFF state again and the second predetermined time tb elapses from the point of time when the first transistor 31B in the drive circuit 40B on the other side is switched from the OFF state to the ON state. For this reason, even if a factor causing unintentional voltage fluctuation occurs in the gate terminal 31g of the first transistor 31A on the higher side while the first transistor 31B on the lower side is in the ON state, fluctuation of the voltage of the gate terminal 31g can be curbed by the fifth transistor 35A. Therefore, fluctuation of the gate voltage VG1A of the first transistor 31A can be more favorably curbed.

Third Embodiment

A third embodiment differs from the first embodiment in that a second transistor 332A is an N channel-type transistor. In the following description, the same reference signs are suitably applied to constitutions similar to those in the embodiments described above, and description may be omitted.

Figure 9:
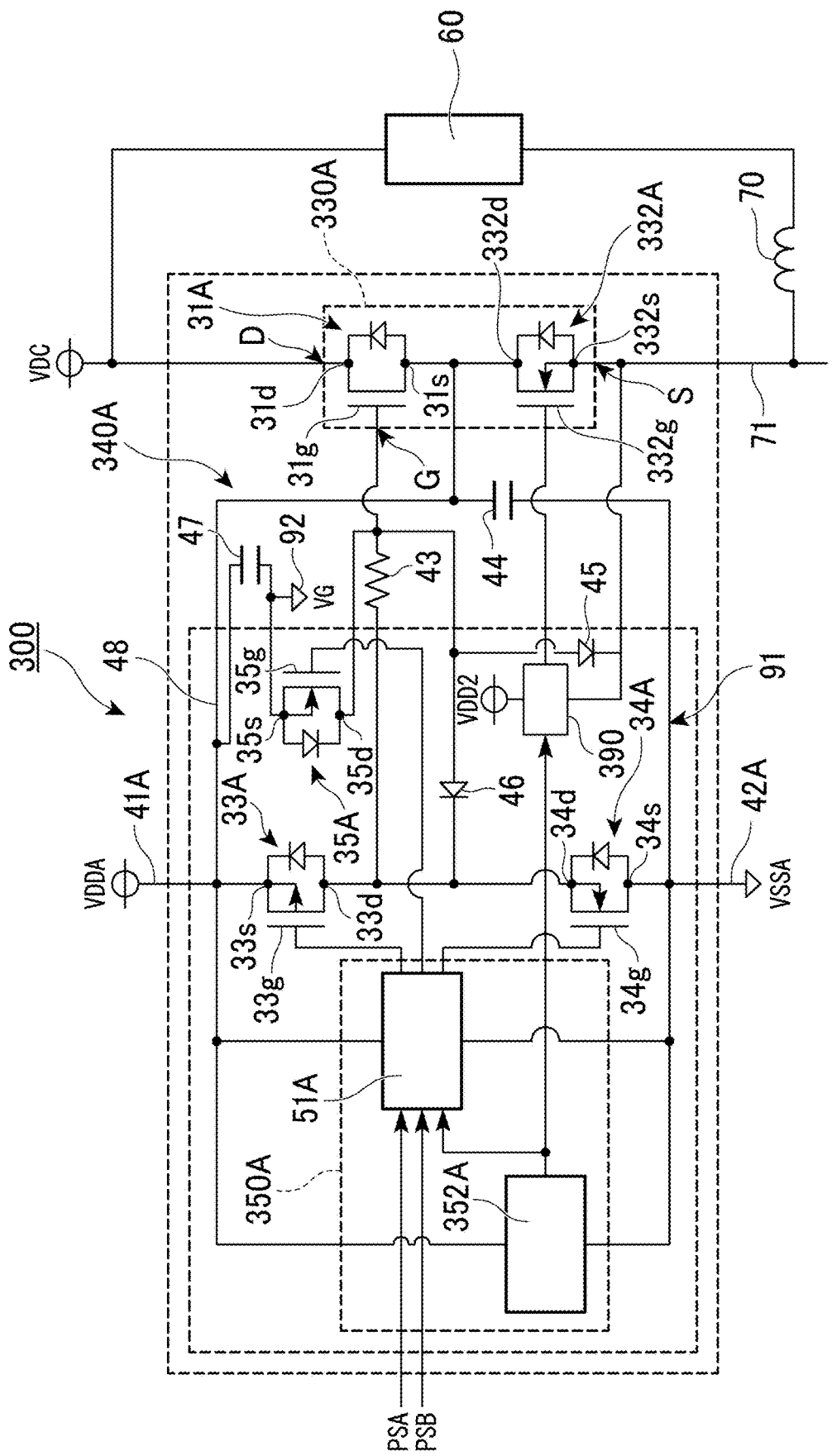
FIG. 9 is a circuit diagram showing part of a semiconductor device of a third embodiment.

FIG. 9 is a circuit diagram showing part of a semiconductor device 300 of the third embodiment. As shown in FIG. 9, in a drive circuit 340A of the third embodiment, the second transistor 332A of a transistor circuit 330A is an N channel-type field-effect transistor. A drain terminal 332d of second transistor 332A is connected to the source terminal 31s of the first transistor 31A. A source terminal 332s of the second transistor 332A is connected to the wiring portion 71. The cathode of the first diode 45 is connected to the source terminal 332s of the second transistor 332A. In the third embodiment, the source terminal 332s of the second transistor 332A is the source terminal S of the transistor circuit 330A.

The drive circuit 340A has a level shifter circuit 390. The level shifter circuit 390 is connected to a gate terminal 332g and the source terminal 332s of the second transistor 332A. A second power source voltage VDD2 is applied to the level shifter circuit 390. The second power source voltage VDD2 is a voltage higher than the power source voltage VDD. In the third embodiment, a voltage comparison circuit 352A of a control circuit 350A outputs comparison results of the power source voltage VDD to the switching circuit 51A and the level shifter circuit 390.

When a signal indicating that the power source voltage VDD from the voltage comparison circuit 352A has exceeded the absolute value Vth of the threshold voltage of the first transistor 31A is input, the level shifter circuit 390 applies the second power source voltage VDD2 to the gate terminal 332g of the second transistor 332A. Accordingly, the second transistor 332A is in the ON state. In the third embodiment, when a signal indicating that the power source voltage VDD has become equal to or higher than the value Vh which is higher than the absolute value Vth of the threshold voltage of the first transistor 31A is input from the voltage comparison circuit 352A, the level shifter circuit 390 causes the second transistor 332A to be in the ON state by applying the second power source voltage VDD2 to the gate terminal 332g of the second transistor 332A. When the power source voltage VDD is lower than the value Vh, for example, the level shifter circuit 390 causes the second transistor 332A to be in the OFF state by short-circuiting the gate terminal 332g and the source terminal 332s of the second transistor 332A.

During a switching operation of the semiconductor device 300, the timing when the state of the second transistor 332A is switched is the same as the timing when the state of the second transistor 32A according to the first embodiment is switched. In the third embodiment as well, similar to the first embodiment, the occurrence of the undershooting US and generation of the induced voltage PV in the gate voltage VG1A of the first transistor 31A can be curbed by driving the fifth transistor 35A.

Other constitutions of the drive circuit 340A are similar to other constitutions of the drive circuit 40A according to the first embodiment. Other constitutions of the semiconductor device 300 are similar to other constitutions of the semiconductor device 100 according to the first embodiment.

Fourth Embodiment

Figure 10:
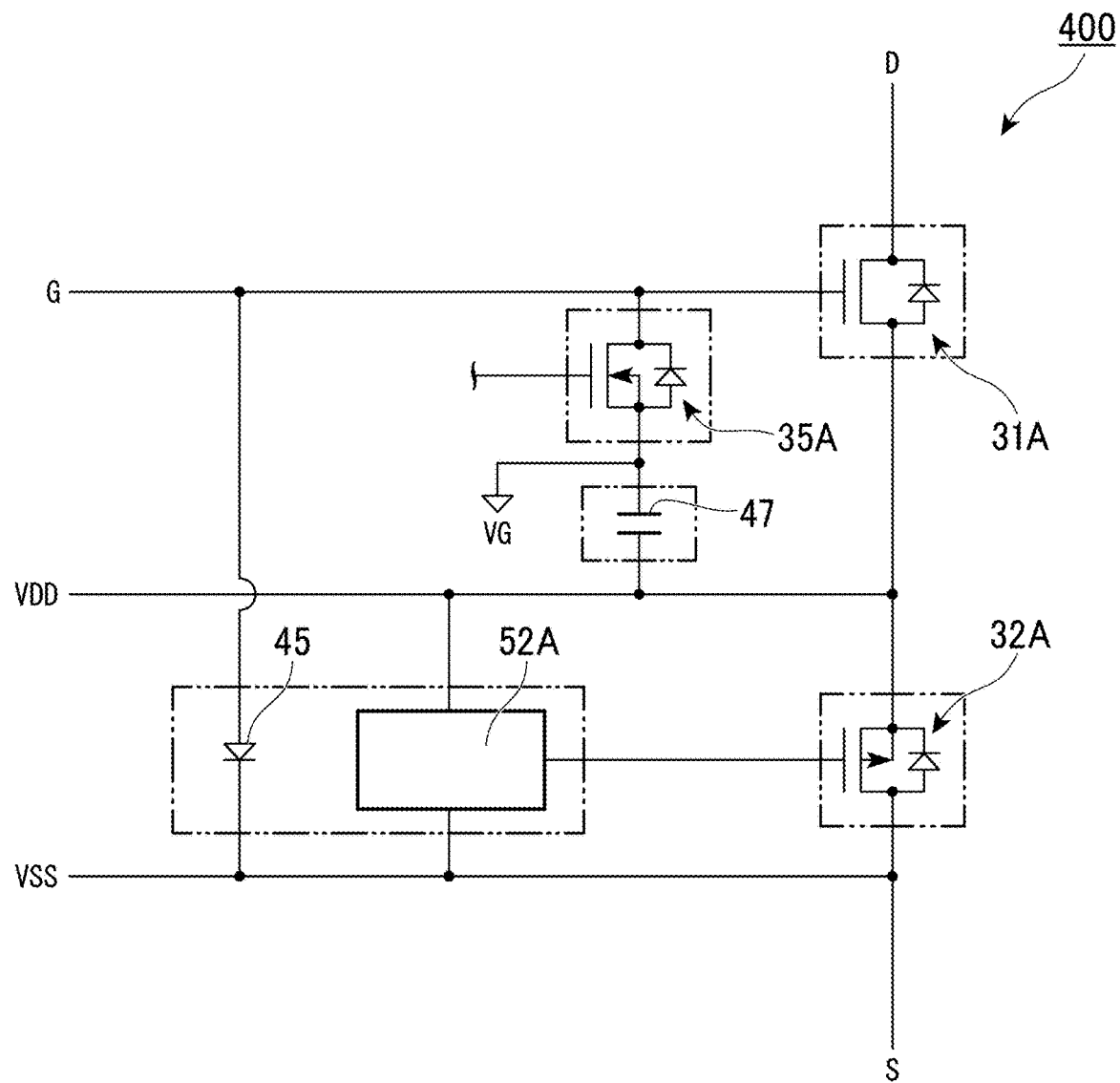
FIG. 10 is a circuit diagram showing part of a semiconductor device of a fourth embodiment.

A fourth embodiment differs from the first embodiment in the constitution of a chip constituting a semiconductor device 400. In the following description, the same reference signs are suitably applied to constitutions similar to those in the embodiments FIG. 10 is a circuit diagram showing part of the semiconductor device 400 of the fourth embodiment. Although the diagram differs, the constitution of the circuit in the semiconductor device 400 shown in FIG. 10 is similar to the constitution of the circuit in the semiconductor device 100 of the first embodiment. In FIG. 10, part of the constitution of the circuit of the semiconductor device 400 is suitably omitted. The plurality of parts surrounded by frames of two-dot dashed lines in FIG. 10 are mounted on separate chips.

As shown in FIG. 10, in the fourth embodiment, the first transistor 31A, the second transistor 32A, the fifth transistor 35A, and the second capacitor 47 are each mounted on different chips from each other. The voltage comparison circuit 52A and the first diode 45 are mounted on the same chip. The chip on which the voltage comparison circuit 52A and the first diode 45 are mounted differs from the chips on which the first transistor 31A, the second transistor 32A, the fifth transistor 35A, and the second capacitor 47 are each mounted. Other constitutions of the semiconductor device 400 are similar to other constitutions of the semiconductor device 100 according to the first embodiment.

Fifth Embodiment

A fifth embodiment differs from the first embodiment in the constitution of a chip constituting a semiconductor device 500. In the following description, the same reference signs are suitably applied to constitutions similar to those in the embodiments described above, and description may be omitted.

Figure 11:
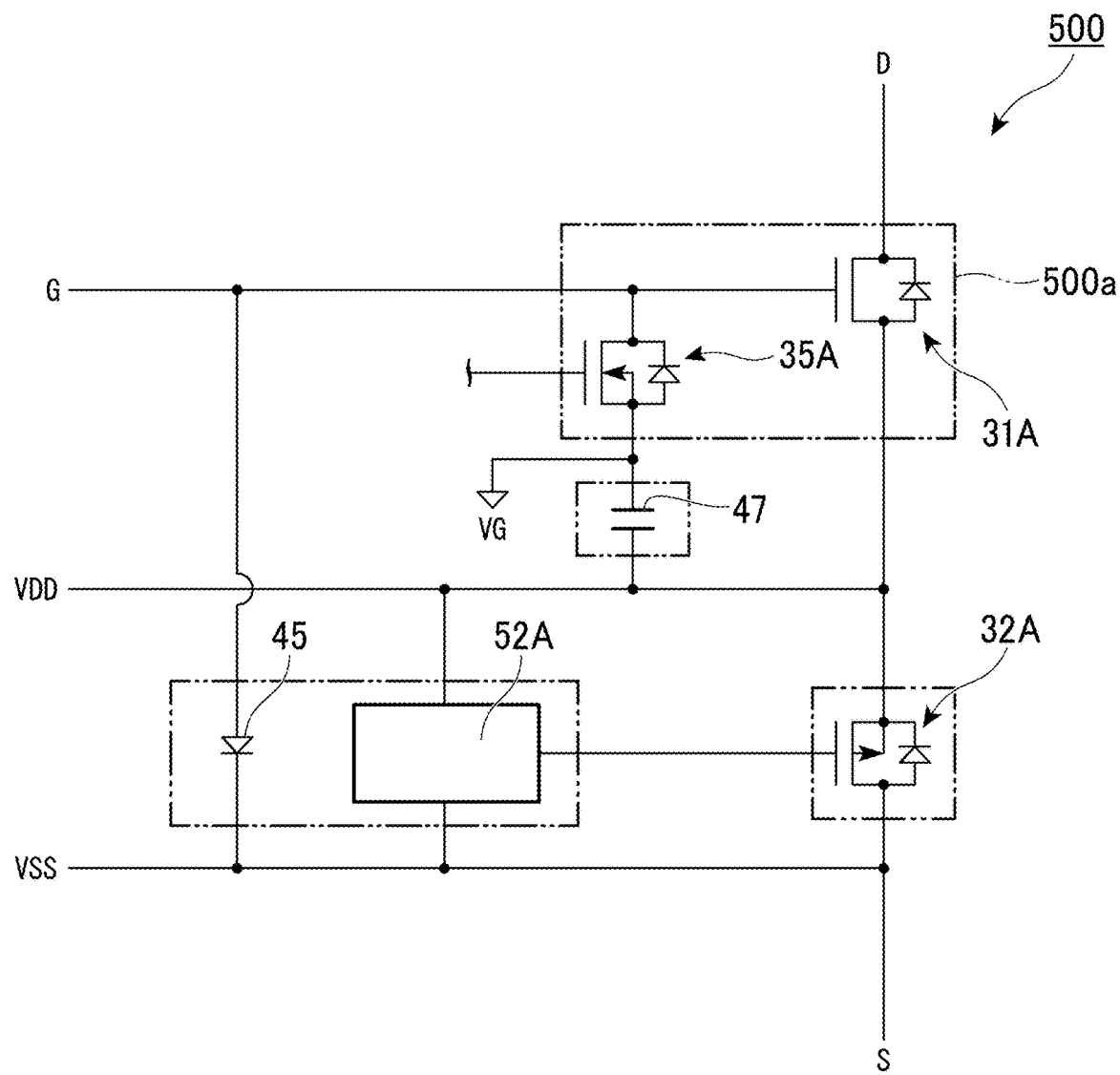
FIG. 11 is a circuit diagram showing part of a semiconductor device of a fifth embodiment.

FIG. 11 is a circuit diagram showing part of the semiconductor device 500 of the fifth embodiment. Although the diagram differs, the constitution of the circuit in the semiconductor device 500 shown in FIG. 11 is similar to the constitution of the circuit in the semiconductor device 100 of the first embodiment. In FIG. 11, part of the constitution of the circuit of the semiconductor device 500 is suitably omitted. The plurality of parts surrounded by frames of two-dot dashed lines in FIG. 11 are mounted on separate chips.

As shown in FIG. 11, in the fifth embodiment, the fifth transistor 35A and the first transistor 31A are mounted on the same semiconductor chip 500a. For this reason, compared to when the fifth transistor 35A and the first transistor 31A are mounted on separate semiconductor chips, the wiring length of the circuit part including the fifth transistor 35A and the first transistor 31A can be shortened, and the impedance of the circuit part can be decreased.

The second transistor 32A, the second capacitor 47, the voltage comparison circuit 52A, and the first diode 45 are similar to those in the fourth embodiment. Other constitutions of the semiconductor device 500 are similar to other constitutions of the semiconductor device 100 according to the first embodiment.

Sixth Embodiment

A sixth embodiment differs from the first embodiment in the constitution of a chip constituting a semiconductor device 600. In the following description, the same reference signs are suitably applied to constitutions similar to those in the embodiments described above, and description may be omitted.

Figure 12:
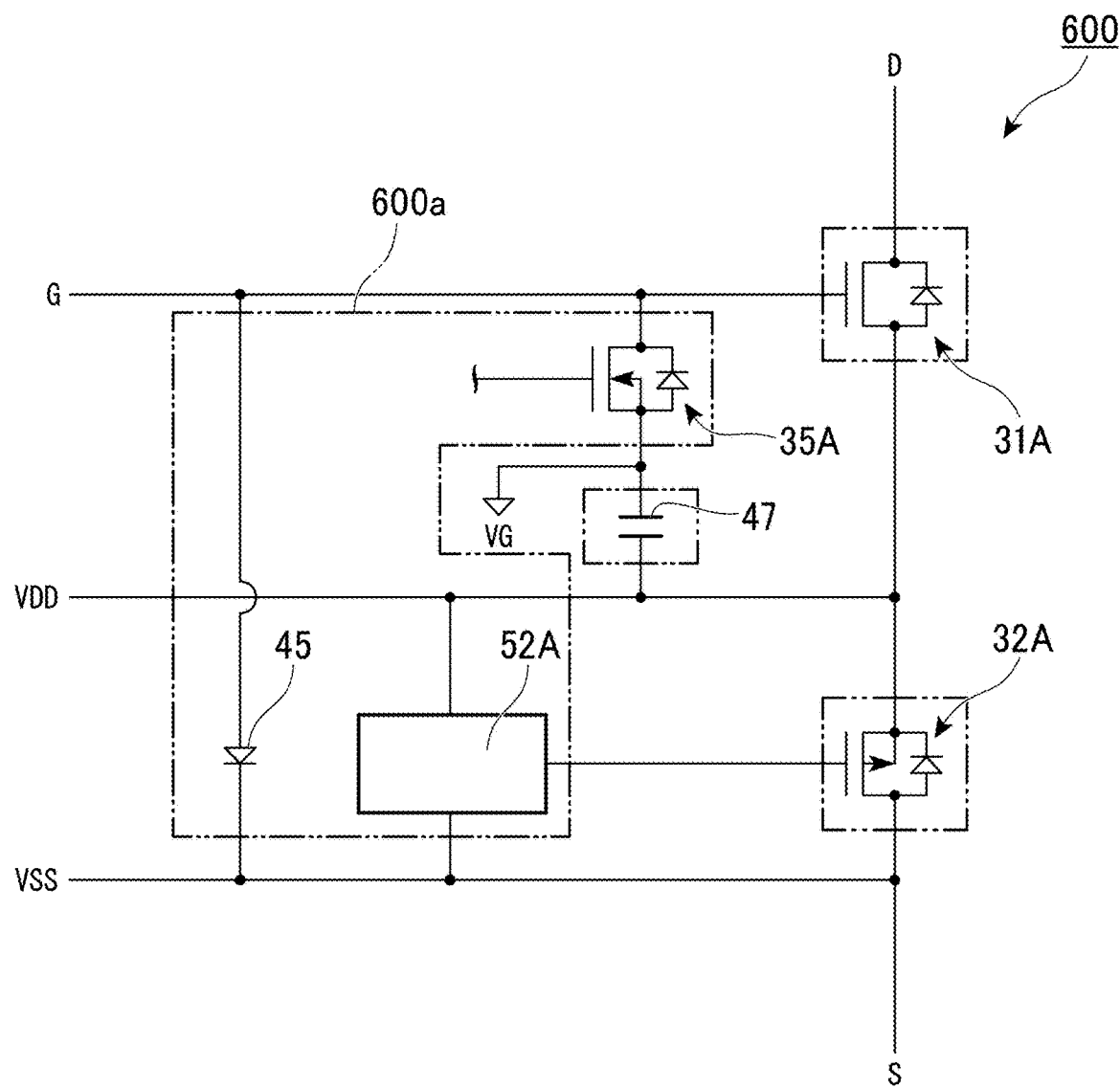
FIG. 12 is a circuit diagram showing part of a semiconductor device of a sixth embodiment.

FIG. 12 is a circuit diagram showing part of the semiconductor device 600 of the sixth embodiment. Although the diagram differs, the constitution of the circuit in the semiconductor device 600 shown in FIG. 12 is similar to the constitution of the circuit in the semiconductor device 100 of the first embodiment. In FIG. 12, part of the constitution of the circuit of the semiconductor device 600 is suitably omitted. The plurality of parts surrounded by frames of two-dot dashed lines in FIG. 12 are mounted on separate chips.

As shown in FIG. 12, in the sixth embodiment, the fifth transistor 35A, the voltage comparison circuit 52A, and the first diode 45 are mounted on the same semiconductor chip 600a. For this reason, compared to when the fifth transistor 35A, the voltage comparison circuit 52A, and the first diode 45 are mounted on separate semiconductor chips, the wiring length of the circuit part including the fifth transistor 35A, the voltage comparison circuit 52A, and the first diode 45 can be shortened, and the impedance of the circuit part can be decreased. For example, the third transistor 33A, the fourth transistor 34A, and the switching circuit 51A are not mounted on the semiconductor chip 600a. The third transistor 33A, the fourth transistor 34A, and the switching circuit 51A are mounted on a semiconductor chip different from the semiconductor chip 600a.

The first transistor 31A, the second transistor 32A, and the second capacitor 47 are similar to those in the fourth embodiment. Other constitutions of the semiconductor device 600 are similar to other constitutions of the semiconductor device 100 according to the first embodiment.

Seventh Embodiment

A seventh embodiment is an embodiment of a boost converter in which a semiconductor device 700 is mounted. In the following description, the same reference signs are suitably applied to constitutions similar to those in the embodiments described above, and description may be omitted.

Figure 13:
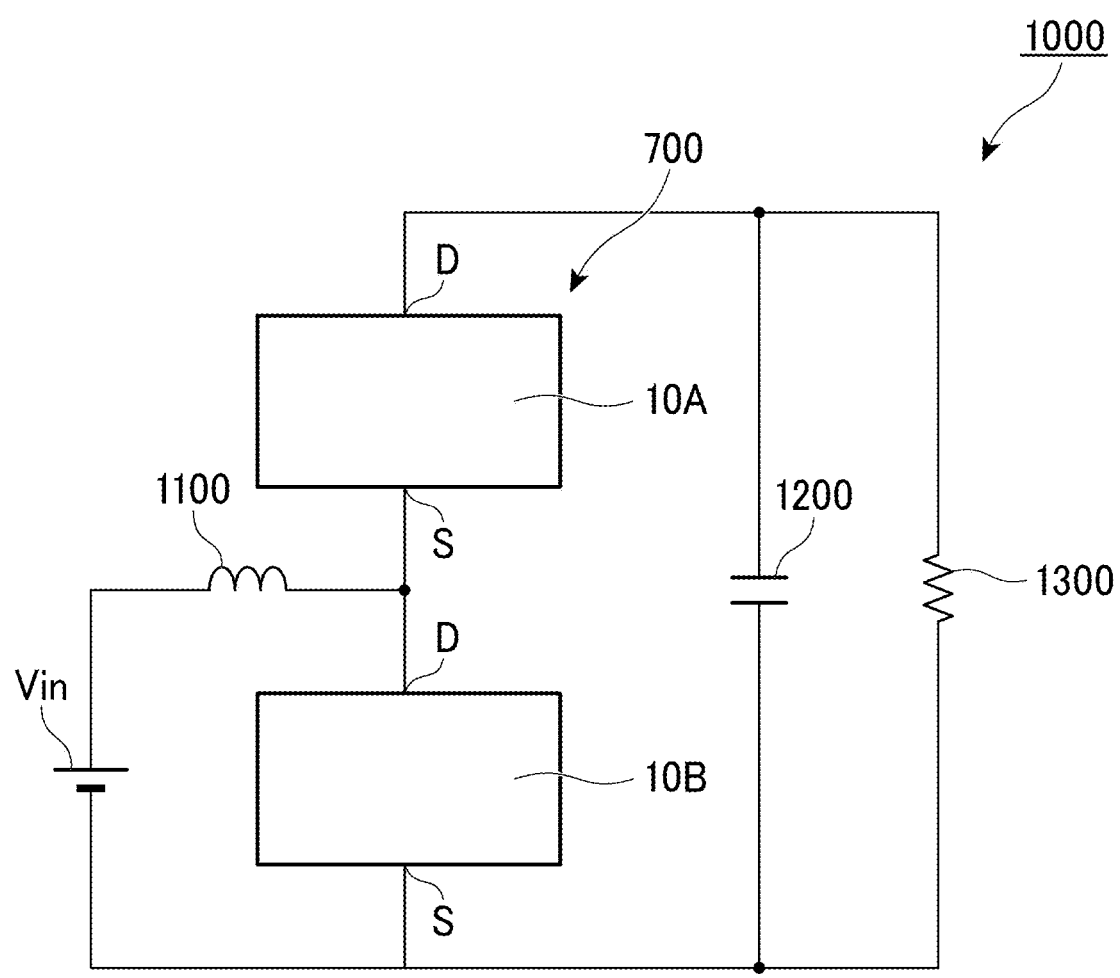
FIG. 13 is a circuit diagram showing a boost converter of a seventh embodiment.

FIG. 13 is a circuit diagram showing a boost converter 1000 of the seventh embodiment. The boost converter 1000 includes the semiconductor device 700, a coil 1100, a third capacitor 1200, and a resistive element 1300. The structure of the semiconductor device 700 is similar to the structure of the semiconductor device 100 according to the first embodiment. The semiconductor device 700 has two semiconductor packages 10A and 10B.

The semiconductor package 10A and the semiconductor package 10B are connected to each other in series. One end of the coil 1100 is connected between the semiconductor package 10A and the semiconductor package 10B. The one end of the coil 1100 is connected to the source terminal S of the semiconductor package 10A and the drain terminal D of the semiconductor package 10B. A power source Vin is connected to the other end of the coil 1100 in series. A positive electrode of the power source Vin is connected to the coil 1100. A negative electrode of the power source Vin is connected to the source terminal S of the semiconductor package 10B.

One electrode of the third capacitor 1200 is connected to the drain terminal D of the semiconductor package 10A. The other electrode of the third capacitor 1200 is connected to the source terminal S of the semiconductor package 10B. The resistive element 1300 is connected to the third capacitor 1200 in parallel. One end of the resistive element 1300 is connected to the drain terminal D of the semiconductor package 10A. The other end of the resistive element 1300 is connected to the source terminal S of the semiconductor package 10B.

In the case of a circuit having the same constitution as that of the boost converter 1000 according to the seventh embodiment, when the state of the transistor circuit 30B in the semiconductor package 10B on the lower side is switched, there is concern that the undershooting US may occur and the induced voltage PV may be generated in the gate voltage VG1A of the first transistor 31A of the transistor circuit 30A in the semiconductor package 10A on the higher side. In contrast, similar to the first embodiment, the occurrence of the undershooting US and generation of the induced voltage PV in the gate voltage VG1A of the first transistor 31A can be curbed by operating the fifth transistor 35A of the semiconductor package 10A on the higher side.

Eighth Embodiment

An eighth embodiment is an embodiment of a step-down converter in which a semiconductor device 800 is mounted. In the following description, the same reference signs are suitably applied to constitutions similar to those in the embodiments described above, and description may be omitted.

Figure 14:
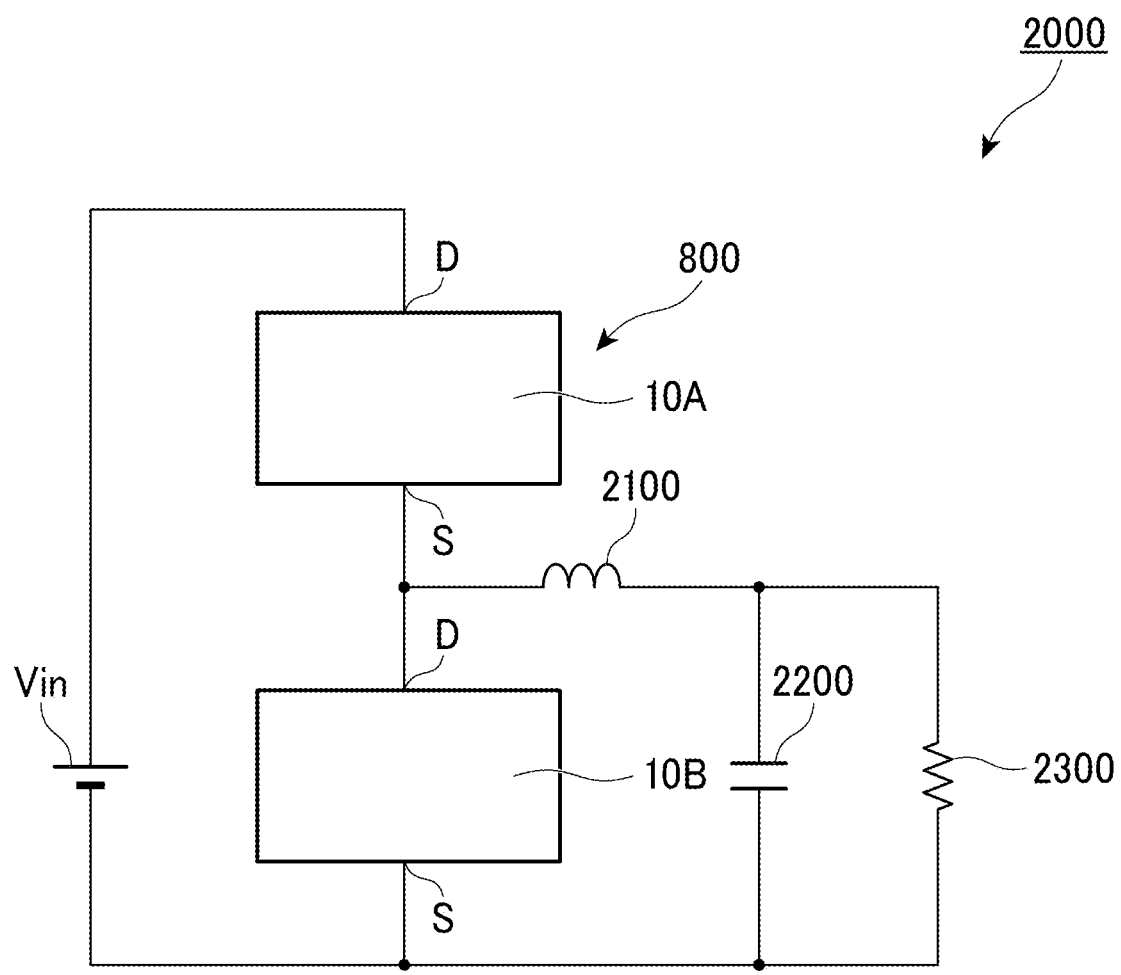
FIG. 14 is a circuit diagram showing a step-down converter of an eighth embodiment.

FIG. 14 is a circuit diagram showing a step-down converter 2000 of the eighth embodiment. The step-down converter 2000 includes the semiconductor device 800, a coil 2100, a fourth capacitor 2200, and a resistive element 2300. The structure of the semiconductor device 800 is similar to the structure of the semiconductor device 100 according to the first embodiment. The semiconductor device 800 has two semiconductor packages 10A and 10B.

The semiconductor package 10A and the semiconductor package 10B are connected to each other in series. One end of the coil 2100 is connected between the semiconductor package 10A and the semiconductor package 10B. The one end of the coil 2100 is connected to the source terminal S of the semiconductor package 10A and the drain terminal D of the semiconductor package 10B. One electrode of the fourth capacitor 2200 and one end of the resistive element 2300 are connected to the other end of the coil 2100. The fourth capacitor 2200 and the resistive element 2300 are connected to each other in parallel. The other electrode of the fourth capacitor 2200 and the other end of the resistive element 2300 are connected to the source terminal S of the semiconductor package 10B. The positive electrode of the power source Vin is connected to the drain terminal D of the semiconductor package 10A. The negative electrode of the power source Vin is connected to the source terminal S of the semiconductor package 10B.

In the case of a circuit having the same constitution as that of the step-down converter 2000 according to the eighth embodiment, when the state of the transistor circuit 30A in the semiconductor package 10A on the higher side is switched, there is concern that the undershooting US may occur and the induced voltage PV may be generated in the gate voltage VG1B of the first transistor 31B of the transistor circuit 30B in the semiconductor package 10B on the lower side. In contrast, the occurrence of the undershooting US and generation of the induced voltage PV in the gate voltage VG1B of the first transistor 31B can be curbed by operating the fifth transistor 35B of the semiconductor package 10B on the lower side similarly to the fifth transistor 35A on the higher side according to the first embodiment.

According to at least one of the embodiments described above, the drive circuit normally-off drives a transistor circuit constituted of a normally-on-type first transistor and a normally-off-type second transistor which are connected in series. The drive circuit has a clamping transistor that is disposed between a wiring, which is connected between the first transistor and the second transistor, and a drive terminal of the first transistor and functions as a clamping element; and a capacitor that is disposed between the clamping transistor and the wiring and is connected to the clamping transistor in series. Accordingly, the occurrence of undershooting in the drive voltage of the first transistor can be curbed.

The first transistor may be any type of transistor as long as it is a normally-on-type transistor. The second transistor may be any type of transistor as long as it is a normally-off-type transistor. The third transistor may be any type of transistor as long as it is disposed between the power source voltage wiring and the drive terminal of the first transistor and the ON/OFF state thereof is switched by the control circuit. The fourth transistor may be any type of transistor as long as it is disposed between the first ground and the drive terminal of the first transistor and the ON/OFF state thereof is switched by the control circuit. The clamping transistor (fifth transistor) may be any type of transistor as long as it is disposed between a wiring, which is connected between the first transistor and the second transistor, and the drive terminal of the first transistor and functions as the clamping element.

The wiring connected between the first transistor and the second transistor may also be a wiring other than a power source voltage wiring. The control circuit may have any type of constitution. The control circuit may have a constitution in which a voltage applied to the second transistor, the third transistor, the fourth transistor, and the fifth transistor is switched by a switching element such as a transistor, or may be constituted to include a microprocessor or the like. The element included in the semiconductor chip provided in the drive circuit is not particularly limited. The element included in the semiconductor package provided in the semiconductor device is not particularly limited. The semiconductor device may be simply constituted of one semiconductor package.

The drive circuit and the semiconductor device according to the embodiments may be applied to any circuit. For example, the drive circuit and the semiconductor device according to the embodiments may be applied to full-bridge circuits. In this case, there is concern that the undershooting US may occur and the induced voltage PV may be generated in both the gate voltage of the first transistor on the higher side and the gate voltage of the first transistor on the lower side. In this case, the occurrence of the undershooting US and generation of the induced voltage PV can be curbed in both the gate voltage of the first transistor on the higher side and the gate voltage of the first transistor on the lower side by driving each of the clamping transistor on the higher side and the clamping transistor on the lower side as in the embodiments described above.

The functionality of the elements disclosed herein may be implemented using circuitry or processing circuitry which includes general purpose processors, special purpose processors, integrated circuits, ASICs ("Application Specific Integrated Circuits"), FPGAs ("Field Programmable Gate Arrays"), conventional circuitry and/or combinations thereof which are programmed, using one or more programs stored in one or more memories, or otherwise configured to perform the disclosed functionality. Processors are considered processing circuitry or circuitry as they include transistors and other circuitry therein. The processor may be a programmed processor which executes a program stored in a memory. In the disclosure, the circuitry, units, or means are hardware that carry out or are programmed to perform the recited functionality. The hardware may be any hardware disclosed herein which is programmed or configured to carry out the recited functionality.

There is a memory that stores a computer program which includes computer instructions. These computer instructions provide the logic and routines that enable the hardware (e.g., processing circuitry or circuitry) to perform the method disclosed herein. This computer program can be implemented in known formats as a computer-readable storage medium, a computer program product, a memory device, a record medium such as a CD-ROM or DVD, and/or the memory of a FPGA or ASIC.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. The drive circuit and the semiconductor device according to the embodiments include forms of the following appendices.

(Appendix 1)

A drive circuit normally-off drives a transistor circuit constituted of a normally-on-type first transistor and a normally-off-type second transistor which are connected in series. The drive circuit includes a clamping transistor that is disposed between a wiring, which is connected between the first transistor and the second transistor, and a drive terminal of the first transistor; and a capacitor that is disposed between the clamping transistor and the wiring and is connected to the clamping transistor in series.

(Appendix 2)

In the drive circuit according to Appendix 1, an electrostatic capacitance of the capacitor is equal to or larger than ten times an input capacitance of the first transistor.

(Appendix 3)

In the drive circuit according to Appendix 1 or Appendix 2, an output capacitance of the clamping transistor is equal to or smaller than one tenth of an input capacitance of the first transistor.

(Appendix 4)

In the drive circuit according to any one of Appendix 1 to Appendix 3, the wiring is a power source voltage wiring for applying a power source voltage.

(Appendix 5)

The drive circuit according to Appendix 4 further includes a third transistor that is disposed between the power source voltage wiring and the drive terminal of the first transistor, a fourth transistor that is disposed between a first ground and the drive terminal of the first transistor, and a control circuit that switches each of the second transistor, the third transistor, the fourth transistor, and the clamping transistor between an ON state and an OFF state.

(Appendix 6)

In the drive circuit according to Appendix 5, an output terminal of the clamping transistor is connected to a second ground which is provided separately from the first ground.

(Appendix 7)

In the drive circuit according to Appendix 5 or Appendix 6, the control circuit has a voltage comparison circuit which switches a state of the second transistor on the basis of a result of comparison between the power source voltage and an absolute value of a threshold voltage of the first transistor. The clamping transistor and the voltage comparison circuit are mounted on the same semiconductor chip.

(Appendix 8)

In the drive circuit according to Appendix 7, the clamping transistor, the third transistor, the fourth transistor, and the control circuit are mounted on the same semiconductor chip.

(Appendix 9)

A semiconductor device includes two drive circuits according to any one of Appendix 5 to Appendix 8, and the two transistor circuits that are normally-off driven by the drive circuits. The two drive circuits respectively drive the two transistor circuits. The two transistor circuits are connected to each other in series and constitute a half-bridge circuit. The control circuit of the drive circuit on one side switches the clamping transistor in the drive circuit on one side between the ON state and the OFF state on the basis of a state of the drive circuit on the other side.

(Appendix 10)

In the semiconductor device according to Appendix 9, the control circuit of the drive circuit on one side causes the clamping transistor in the drive circuit on one side to be in the ON state during a period until at least a first predetermined time elapses from the point of time when the first transistor in the drive circuit on the other side is switched from the OFF state to the ON state.

(Appendix 11)

In the semiconductor device according to Appendix 9 or Appendix 10, the control circuit of the drive circuit on one side causes the clamping transistor in the drive circuit on one side to be in the ON state during a period until at least a second predetermined time elapses from the point of time when the first transistor in the drive circuit on the other side is switched from the ON state to the OFF state, and causes the clamping transistor to be in the OFF state before starting control of causing the first transistor in the drive circuit on one side to be in the ON state after the first transistor in the drive circuit on the other side is switched from the ON state to the OFF state.

(Appendix 12)

In the semiconductor device according to Appendix 11, the control circuit of the drive circuit on one side causes the clamping transistor to be in the OFF state when the second predetermined time has elapsed from the point of time when the first transistor in the drive circuit on the other side is switched from the ON state to the OFF state.

(Appendix 13)

In the semiconductor device according to Appendix 11 or Appendix 12, the control circuit of the drive circuit on one side causes the clamping transistor in the drive circuit on one side to be in the ON state during a period until the second predetermined time elapses after the first transistor is switched to the OFF state again from the point of time when the first transistor in the drive circuit on the other side is switched from the OFF state to the ON state.

(Appendix 14)

A semiconductor device includes the drive circuit according to any one of Appendix 1 to Appendix 8, and the transistor circuit that is normally-off driven by the drive circuit.

(Appendix 15)

In the semiconductor device according to any one of Appendix 9 to Appendix 14, the clamping transistor and the first transistor are mounted on the same semiconductor chip.

What is claimed is:

1. A drive circuit that normally-off drives a transistor circuit constituted of a normally-on-type first transistor and a normally-off-type second transistor which are connected in series, the drive circuit comprising:
   a clamping transistor that is disposed between a wiring, which is connected between the first transistor and the second transistor, and a drive terminal of the first transistor; and
   a capacitor that is disposed between the clamping transistor and the wiring and is connected to the clamping transistor in series.

2. The drive circuit according to claim 1,
   wherein an electrostatic capacitance of the capacitor is equal to or larger than ten times an input capacitance of the first transistor.

3. The drive circuit according to claim 1,
   wherein an output capacitance of the clamping transistor is equal to or smaller than one tenth of an input capacitance of the first transistor.

4. The drive circuit according to claim 1,
   wherein the wiring is a power source voltage wiring for applying a power source voltage.

5. The drive circuit according to claim 4, further comprising:
   a third transistor that is disposed between the power source voltage wiring and the drive terminal of the first transistor;
   a fourth transistor that is disposed between a first ground and the drive terminal of the first transistor; and
   a control circuit that switches each of the second transistor, the third transistor, the fourth transistor, and the clamping transistor between an ON state and an OFF state.

6. The drive circuit according to claim 5,
   wherein an output terminal of the clamping transistor is connected to a second ground which is provided separately from the first ground.

7. The drive circuit according to claim 5,
   wherein the control circuit has a voltage comparison circuit which switches a state of the second transistor on the basis of a result of comparison between the power source voltage and an absolute value of a threshold voltage of the first transistor, and
   the clamping transistor and the voltage comparison circuit are mounted on the same semiconductor chip.

8. The drive circuit according to claim 7,
   wherein the clamping transistor, the third transistor, the fourth transistor, and the control circuit are mounted on the same semiconductor chip.

9. A semiconductor device comprising:
   two drive circuits that each normally-off drive a transistor circuit constituted of a normally-on-type first transistor and a normally-off-type second transistor which are connected in series; and
   the two transistor circuits that are normally-off driven by the drive circuits,
   wherein each of the two drive circuits includes
      a clamping transistor that is disposed between a wiring, which is connected between the first transistor and the second transistor, and a drive terminal of the first transistor,
      a capacitor that is disposed between the clamping transistor and the wiring and is connected to the clamping transistor in series,
      a third transistor that is disposed between the wiring and the drive terminal of the first transistor,
      a fourth transistor that is disposed between a first ground and the drive terminal of the first transistor, and
      a control circuit that switches each of the second transistor, the third transistor, the fourth transistor, and the clamping transistor between an ON state and an OFF state, and the two drive circuits respectively drive the two transistor circuits,
   the wiring is a power source voltage wiring for applying a power source voltage,
   the two transistor circuits are connected to each other in series and constitute a half-bridge circuit, and
   the control circuit of the drive circuit on one side switches the clamping transistor in the drive circuit on one side between the ON state and the OFF state on the basis of a state of the drive circuit on the other side.

10. The semiconductor device according to claim 9,
    wherein the control circuit of the drive circuit on one side causes the clamping transistor in the drive circuit on one side to be in the ON state during a period until at least a first predetermined time elapses from the point of time when the first transistor in the drive circuit on the other side is switched from the OFF state to the ON state.

11. The semiconductor device according to claim 9,
    wherein the control circuit of the drive circuit on one side causes the clamping transistor in the drive circuit on one side to be in the ON state during a period until at least a second predetermined time elapses from the point of time when the first transistor in the drive circuit on the other side is switched from the ON state to the OFF state, and
    causes the clamping transistor to be in the OFF state before starting control of causing the first transistor in the drive circuit on one side to be in the ON state after the first transistor in the drive circuit on the other side is switched from the ON state to the OFF state.

12. The semiconductor device according to claim 11,
    wherein the control circuit of the drive circuit on one side causes the clamping transistor to be in the OFF state when the second predetermined time has elapsed from the point of time when the first transistor in the drive circuit on the other side is switched from the ON state to the OFF state.

13. The semiconductor device according to claim 11,
wherein the control circuit of the drive circuit on one side causes the clamping transistor in the drive circuit on one side to be in the ON state during a period until the second predetermined time elapses after the first transistor is switched to the OFF state again from the point of time when the first transistor in the drive circuit on the other side is switched from the OFF state to the ON state.

14. The semiconductor device according to claim 9,
wherein the clamping transistor and the first transistor are mounted on the same semiconductor chip.

15. A semiconductor device comprising:
a drive circuit that normally-off drives a transistor circuit constituted of a normally-on-type first transistor and a normally-off-type second transistor which are connected in series; and
the transistor circuit that is normally-off driven by the drive circuit,
wherein the drive circuit includes
    a clamping transistor that is disposed between a wiring, which is connected between the first transistor and the second transistor, and a drive terminal of the first transistor, and
    a capacitor that is disposed between the clamping transistor and the wiring and is connected to the clamping transistor in series.

16. A drive circuit that normally-off drives a transistor circuit constituted of a normally-on-type first transistor and a normally-off-type second transistor which are connected in series, the drive circuit comprising:
    a transistor that is disposed between a wiring, which is connected between the first transistor and the second transistor, and a drive terminal of the first transistor; and
    a capacitor that is disposed between the first transistor and the wiring and is connected to the first transistor in series.

17. The drive circuit according to claim 16,
wherein an electrostatic capacitance of the capacitor is equal to or larger than ten times an input capacitance of the first transistor.

18. The drive circuit according to claim 16,
wherein an output capacitance of the first transistor is equal to or smaller than one tenth of an input capacitance of the first transistor.

19. The drive circuit according to claim 16,
wherein the wiring is a power source voltage wiring for applying a power source voltage.

20. The drive circuit according to claim 19, further comprising:
    a third transistor that is disposed between the power source voltage wiring and the drive terminal of the first transistor;
    a fourth transistor that is disposed between a first ground and the drive terminal of the first transistor; and
    a control circuit that switches each of the second transistor, the third transistor, the fourth transistor, and the first transistor between an ON state and an OFF state.

* * * * *